United States Patent [19]
Sunter et al.

[11] Patent Number: 5,923,676
[45] Date of Patent: Jul. 13, 1999

[54] BIST ARCHITECTURE FOR MEASUREMENT OF INTEGRATED CIRCUIT DELAYS

[75] Inventors: Stephen K. Sunter, Napean; Benoit Nadeau-Dostie, Québec, both of Canada

[73] Assignee: Logic Vision, Inc., San Jose, Calif.

[21] Appl. No.: 08/771,302

[22] Filed: Dec. 20, 1996

[51] Int. Cl.$^6$ .................................................. G06F 11/00
[52] U.S. Cl. ......................................................... 371/22.5
[58] Field of Search ................................ 371/22.5, 22.1, 371/25.1, 27, 28; 364/470; 365/227, 189.09

[56] References Cited

U.S. PATENT DOCUMENTS

| | | | |
|---|---|---|---|
| 5,083,299 | 1/1992 | Schwanke et al. | 368/113 |
| 5,132,685 | 7/1992 | DeWitt et al. | 341/120 |
| 5,822,267 | 10/1998 | Watanabe et al. | 365/227 |

OTHER PUBLICATIONS

Marcelo Lubaszewski et al., "A Multifunctional Test Structure for Analog BIST", International Mixed Signal Testing Workshop Proceedings, May 1996, pp. 239–244.

*Primary Examiner*—Vincent P. Canney
*Attorney, Agent, or Firm*—Skjerven, Morrill, MacPherson, Franklin & Friel LLP

[57] ABSTRACT

A built-in self-test (BIST) method and apparatus for digital integrated circuits (ICs) and for systems including multiple ICs, measures signal propagation delays in combinational and sequential logic, set-up and hold times, and tri-state enable/disable times, from any circuit node to any other circuit node including pin-to-pin and from one IC to another. The IC under test is provided with two test bus conductors passing near every circuit node of interest and connected thereto by switches or buffers. During test, an oscillator is created including the test bus, a constant delay, counters, and a delay path of interest or a reference path. The delay path of interest may include e.g. an analog filter. The oscillation period of the oscillator when the reference path is selected is subtracted from the oscillation period when the oscillator includes a delay path of interest. A circuit automatically accommodates inverting and non-inverting paths. A delay copier copies the delay between any two signal events, without injecting any test signal into the circuit under test (e.g. on-line test), and the delay copy can be measured by selecting it in the oscillator.

31 Claims, 18 Drawing Sheets

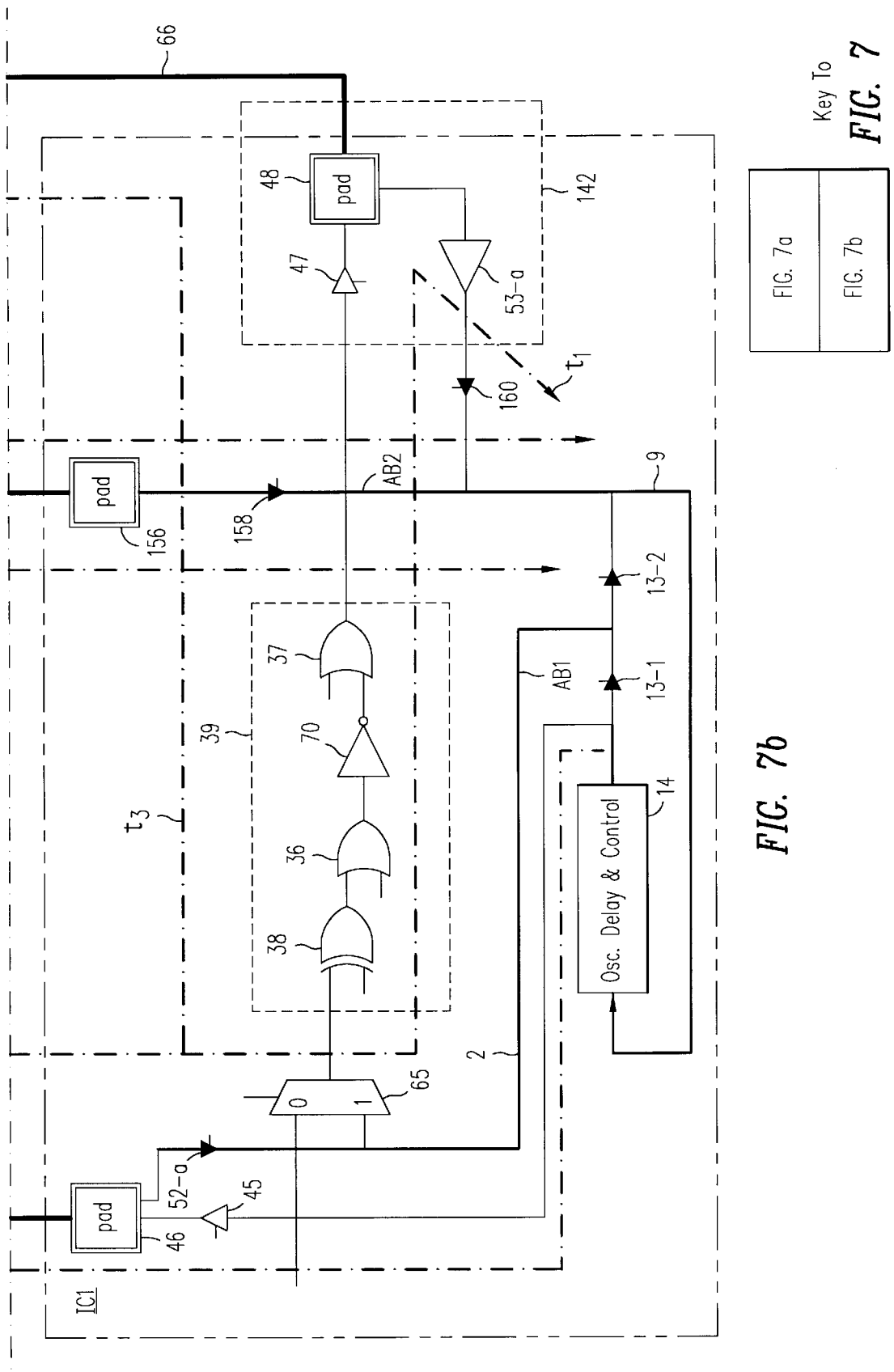

BIST ARCHITECTURE FOR MEASUREMENT OF INTEGRATED CIRCUIT DELAYS

BACKGROUND OF THE INVENTION

1. Field of the Invention

This invention relates to testing of integrated circuits and board level systems including integrated circuits, and more specifically to built-in self-testing of signal propagation delays for such integrated circuits and integrated circuit systems.

2. Description of the Prior Art

Due to increased complexity of integrated circuits (ICs) and reduced access to internal circuit nodes, properly testing such devices has become a major bottleneck during their prototyping, development, production and maintenance. Hence there has arisen the field of built-in self-test wherein circuitry which is intended solely to support testing is included in an integrated circuit and/or in a system including integrated circuits.

For synchronous, "random" logic in digital ICs and IC systems (boards), prior art built-in self test (BIST) schemes detect signal delays using at-speed scan test; for logic related to the pin interface circuitry located at the periphery of the IC, boundary scan is applied at or below the normal clock rate; and for memories such as SRAM, DRAM and ROM special patterns are applied at the normal operating clock rate.

However, many IC signal paths which can contain delay faults are not covered by prior art BIST: these include unclocked combinational logic, asynchronously clocked logic, and gated-clock logic (e.g. ripple counters); paths from an input pad to an output pad; paths which include a tri-state output enable/disable delay, and set-up and hold times.

In addition, due to natural variations in the manufacturing process, some ICs have shorter delays than others, and these faster ICs can be sold at a premium price. Sorting or "binning" of ICs by their performance is often done by measuring the delay in critical paths. These paths are tested by applying a sequence of test patterns to the IC until the delay path of interest in the IC has been "sensitized" such that one additional signal transition on an input pin will cause a signal to propagate through the path of interest to an output pin, whereupon the delay can be measured using off-chip automatic test equipment (ATE). The measurement of delays to accuracies of less than one nanosecond (ns) requires expensive circuitry in ATE at every pin of the IC, so that a delay between any two pins can be measured. This precise timing is a significant contributor to the cost of ATE.

In such timing tests, the tester initiates a measurement by supplying a stimulus waveform to the delay path under test, and then detects when the output of interest has responded. Generally, ATE measures delays by applying a test pattern and detecting whether a selected output signal has an expected value at a precise instant in time; if it does not, then the test pattern is applied again and the output is observed at a different instant in time; this process continues using a binary search until the output signal transition time is bounded by arbitrarily close points in time. The procedure requires accurate time delays in the ATE for placement of the timing edge which samples the circuit's output value. Sometimes the input signal activates two outputs, and the difference in output delays is the important value to be measured. In this case, both delays are measured by the ATE, and one is subtracted from the other. Other equipment is able to measure delay differences by counting high speed clock pulses between the two events and by using analog interpolation between clock pulses.

Another method sometimes used to "bin" ICs according to the delays, is to use a representative logic circuit, namely a ring oscillator on the IC, and measure its frequency of oscillation. A ring oscillator is a chain of inverters or other logic gates permanently connected in a ring or loop, in which the total number of inversions in the loop is odd thus ensuring oscillation, and the loop oscillates at a frequency inversely proportional to the delay around the loop.

It has also been proposed by Arabi & Kaminska in "Oscillator Test Strategy For Analog And Mixed Signal Integrated Circuits", *VLSI Test Symposium*, May 1996, pp. 476–482, that a useful test of analog circuits is to connect the analog circuit's output to its input, via an inverting and/or amplifying circuit (typically, specially designed for each circuit to be tested), to create an oscillator. The feedback circuit is designed such that the oscillation frequency is the maximum that can be achieved by the circuit under test, if it has correct gain and bandwidth. By comparing its oscillation frequency to the expected oscillation frequency, as determined by computer simulation or statistical experiment, the presence of analog defects can be detected.

In another area of delay evaluation, but not typically used for testing, a delay lock loop is used to make a delay path have the same delay as an input, e.g. one clock period. Using feedback, differences between the source delay and the controlled delay cause the control voltage for the controlled delay to change until the controlled delay is correct. The control voltage also controls other delay paths to make them have the same delay (or a ratio thereof). A delay lock loop does not measure delay, but copies it from a repetitive signal for use with other signals.

U.S. Pat. No. 4,875,201 issued Oct. 17, 1989 to Dalzell discloses a timed measurement apparatus including a delay line having accurate delay elements and a plurality of taps, each tap having an associated latch. The arrangement causes oscillation of the delay line in the presence of the first condition of the input signal. The counter counts the oscillations of the delay line, and the latches are caused to operate simultaneously in the second condition of the input signal. This is used for measuring qualities of the signals in a computer network for instance. This disclosure is incorporated herein by reference in its entirety.

U.S. Pat. No. 5,083,299 issued Jan. 21, 1992 to Schwanke et al. discloses a tester for measuring the time with which a signal propagates through an electronic component and which is comprised of a ring oscillator in which pulses are periodically generated and propagated around a loop. Within this loop, a fixture is disposed for selectively holding the electronic component that is to be tested, or a shorting plug, in a removable fashion. Pulses from the ring oscillator propagate through the fixture, and their period reflects whether the component/shorting plug is being held. Coupled to the loop is a timing circuit which generates a timing signal each time it receives a predetermined number of the pulses on the loop. Using this timing signal, the signal propagation delay through the electronic component is determined substantially more accurately than that which is obtainable by measuring propagation delay through the component directly. This disclosure is also incorporated herein by reference in its entirety.

SUMMARY

The present invention is directed to built-in measurement of delays in ICs using only a single externally provided constant frequency as an absolute time reference. This facilitates verification of on-chip delays for new designs, sorting of fast and slow digital ICs for premium pricing, and testing for delay faults caused by defects in unclocked combinational logic, asynchronously clocked logic, gated-clock logic (e.g. ripple counters), paths from an input pad to an output pad, paths which include a tri-state output enable/disable delay, and paths which affect set-up and hold times. The present testing structure and method also allow measurement of the time between any two events, even if one event does not cause the other, e.g. the difference in arrival times of signals on different pins. This is on-line delay measurement, i.e. while the circuit is in normal operation.

Advantageously, on-wafer testing is provided due to the low frequency clock reference needed, the fact that only one clock is needed, and since the integrity of the clock edges is not relevant. This allows testing without use of an off-chip tester.

The inverting or non-inverting signal delay is measured between any two circuit nodes of an integrated circuit, where each node of interest is selectively connected to one or both of two conductors in a test bus, and all logic signals which enable a signal to travel the path of interest (under test) in the IC are set into appropriate logic states. The test bus includes two wires (conductors) on the integrated circuit which pass near each node of interest; each node is selectably connected to the two conductors using transistor switches, tri-state drivers, or the equivalent. One example of such a test bus is the IEEE P1149.4 standard analog test bus.

The delay path under test is made to be selectively part of an oscillator which includes the two conductors, where an arbitrary, constant delay limits the maximum oscillation frequency and a buffer, which is selectively an inverter or a non-inverter, is also connected in the oscillating circuit to ensure that the conditions for oscillation are met. A reference delay path, which is e.g. a wire with approximately zero delay, is also selectively part of the oscillator. Thus by selecting the reference path and then the path under test, and measuring the oscillation period, the difference in oscillation periods is obtained which is equal to the average delay of the path under test.

Also in accordance with the invention, the delay from an input signal which only affects a logic state of a circuit during one of its transitions, e.g. rising or falling but not both, which is e.g. the clock input signal to a D-type flip-flop, is measured to the output signal which changes state. The D-type flip-flop is configured in a test mode such that the logical inverse of its output signal is connected to its data input terminal, so that every active transition of the clock input signal causes the output state of the D flip-flop to change. This path is selectively part of an oscillator, as described above, connected to the test bus conductors where an arbitrary delay limits the maximum oscillation frequency, and a selected fraction of this delay limits the minimum clock pulse width. The combination of these two delays creates a pulse from each transition on the circuit output pin of interest. This pulse in turn clocks the D-type flip-flop once again to form a continuous oscillation. Thus the difference in oscillation periods is equal to the average of the rising and falling output delay of the integrated circuit path under test.

Lastly, in accordance with the invention, delays in a circuit which is in normal operation are measured, without necessarily affecting the normal operation. The delay of interest is copied to a specially constructed delay path ("delay copier"), and then the delay through this second path is measured using oscillation as previously described.

Advantageously in accordance with this invention the wire delay is coupled into the test circuit using electronic switches. Moreover, a special type of multiplexing functionality is provided by use of a conductor driven by a number of selectively enabled tri-state drivers with approximately equal drive, and a reference delay path, i.e. a simple conductor, is one of the input lines to the multiplexer. Moreover, in accordance with this invention the delay of inverting circuits is measured. This is accomplished by the selectively inverting/non-inverting circuit with a constant delay which allows delay measurement for either inverting or noninverting delay paths.

Moreover, in accordance with this invention the delay through sequential logic is measured by making the pulse generator generate a pulse in response to either leading or trailing edges of its input signal, or by generating two pulses in response to a single edge type signal. Moreover, in accordance with this invention it is possible to measure setup and hold times, tri-state buffer enable and disable times, and the gain bandwidth of low pass and high pass filters, all using the "delay copiers" without involving the circuit under test in an oscillator.

In the present delay copier, there is no need to know the value in its counter latches and it is not necessary to derive any output value from their value directly and the delay through each delay element does not need to be accurately known (which allows automated layout). The actual delay measurement takes place in a separate oscillation loop. In order to derive the present delay copy, one calibrates (measures) not only the taps of the delay line, but also the delay added by circuitry which is active when using the copy delayed. Moreover, in terms of counting the oscillations of a delay line, there is no need to actually copy oscillations (number of rising edges) by the signal; instead one counts half oscillations (the number of rising edges plus falling edges). This simplification reduces the amount of decoding logic needed.

Moreover the present test circuit has two modes of operation; first a value is latched which is proportional to the delay of interest, then the circuit becomes (when the mode signal is changed) a constant delay for any subsequent "starting" and generates its own "stopping" at the end of that constant delay.

Similarly labelled elements in the various figures refer to similar or identical structures.

DETAILED DESCRIPTION

Figure 1:
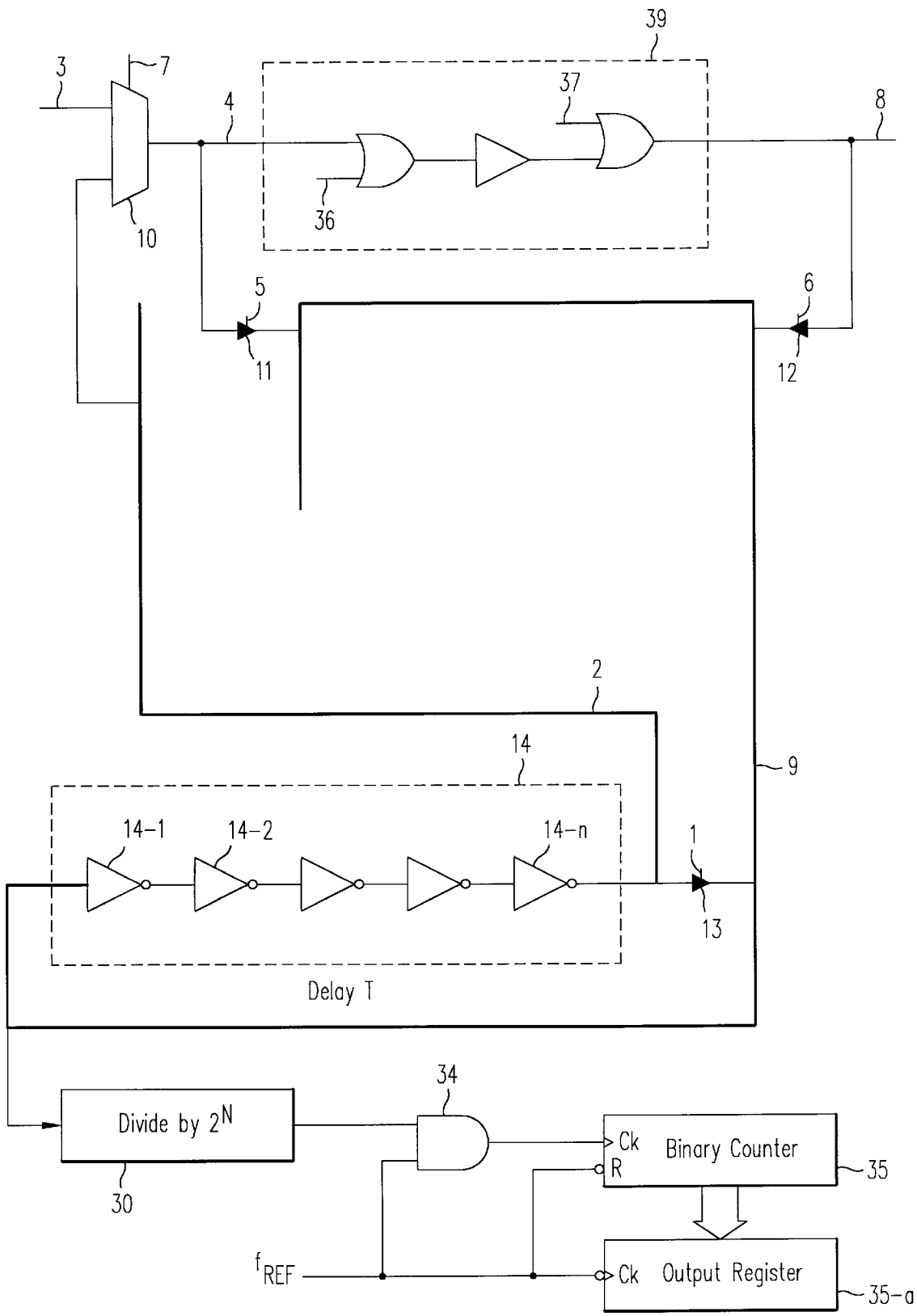
FIG. 1 shows a simplified example of circuitry in accordance with the invention for test of combinational logic delays on an IC.

The IC to be tested is provided with, in one embodiment, a two-wire test bus, which passes near each circuit node of interest. Each node which is an input to a delay path of interest selectively receives its input signal from its normal preceding logic gate or from one of the test bus wires. Each input node is also connected to the second test bus wire via tri-state buffers which are selectively enabled by data registers. In FIG. 1, for simplicity only one delay path of interest is shown; it includes output node 8 and input node 4. The input node 4 is selectively connected by multiplexer (switch) 10 to the normal input node 3 or the test input line 2. We assume that switch 10 is constructed such that paths node 3-to-node 4 and node 2-to-node 4 have the same delay or such that path node 3-to-node 4 has insignificant delay; this is relatively easy to ensure by design.

The present method and apparatus use the delay path of interest, the two-wire test bus, and a constant delay path to create an oscillator for measuring delays as follows.

Reference Delay Path

Referring to FIG. 1: from the output of the delay block 14, a signal travels on test bus wire 2 to switch 10. The switch 10 is enabled via control terminal 7 so that node 4 and its connected circuit capacitances are driven by the signal on test bus wire 2. The signal propagates through the delay path of interest but its output at node 8 is ignored while determining the reference delay. A tri-state buffer 11 is enabled via control terminal 5 between node 4 and the second test bus wire 9, allowing the signal to continue to the input to the delay block 14 which contains e.g. a chain of inverters 14-1, 14-2, ..., 14-n as shown whose delay is e.g. 25 ns. This delay must be constant (e.g. ±1% of the delay of interest) for the duration of the test, but need not be precise. The output signal of the delay block 14 is connected back to test bus wire 2. If the number of logic inversions around the loop described is odd, the entire loop will oscillate.

Circuitry can be incorporated in the delay block to ensure that the loop is always inverting. The reference frequency of oscillation will be the reciprocal of twice the delay around the loop (e.g. 20 MHz is the reciprocal of twice 25 ns), which is determined mostly by the delay block 14, and by the delay through the logic gates or switches which drive the test bus capacitances. This reference oscillation period is measured before including the delay of the circuit under test, i.e. the delay of the path through the circuit between nodes 4 and 8.

Frequency Measurement

Several methods are available to measure an oscillation frequency. One method is that the signal on the test bus second wire 9 drives the input terminal of a first binary (divide by $2^N$) counter 30 (e.g. a synchronous or ripple counter), so that the signal is divided down to a low frequency, e.g. 5 kHz. This low frequency signal gates a reference clock signal of accurately known frequency (e.g. 10 MHz), via AND gate 34, into a second binary counter 35. The number of reference clock pulses counted by counter 35 during a single pulse of the low frequency signal is proportional to the original oscillation period. For example, a single pulse from the 5 kHz output (50% duty cycle) would gate a burst of 1000 pulses from a 10 MHz reference clock, and then the output of counter 35 would be latched into output register 35-a. If an IC uses a divide-by-4096 (i.e. a 12-bit binary counter 30), then 5 kHz corresponds to a loop oscillation period of 48.9 ns (20.48 MHz). Arbitrary resolution is possible by dividing down with counter 30 to lower frequencies than 5 kHz, and/or by using a higher reference clock frequency than 10 MHz.

Combinational Path Delay

After measurement of the reference oscillation loop frequency, the loop is altered to include the delay path of the Delay Under Test 39 by disabling tri-state buffer 11 and enabling tri-state buffer 12 which allows observation of the signal on node 8 which was previously ignored. All other logic gates retain their setting so that all delays due to capacitive loads remain the same. The delay path under test is enabled where necessary by setting appropriate test mode control signals at terminals 36 and 37 to correct values (this is done e.g. using an existing test scan path register).

All tri-state buffers (shown herein shaded in all the figures) connected to bus wire 9 are designed to have identical drive characteristics so that their delays are approximately equal. Drive variations up to 10% will not significantly affect the overall accuracy, because the delay caused by the finite drive will typically be 1 to 5 ns, and hence 10% variation causes 0.1 to 0.5 ns uncertainty.

Circuitry (not shown in FIG. 1, for simplicity) in the delay block 14 ensures that the number of logic inversions around the loop is odd, to ensure oscillation. The inversion circuitry is described below.

This time, the oscillation period will have been increased by twice the delay from node 4 to node 8, the delay path under test. If this new delay is e.g. 5.0 ns, then the new oscillation period will be 58.9 ns (instead of 48.9 ns). The output low frequency will now be 4.145 kHz, and the counter 38 will now count 1206 pulses during a single low frequency pulse. By subtracting from this the count obtained for the reference path, one determines the delay added by the Delay Under Test, i.e. from node 4 to node 8: 1206−1000= 206, and 206/(fref*4096)=5.0 ns. The subtraction can also be accomplished by counting up on the same counter 35 used to count down for the reference oscillator (or vice versa).

This approach can be employed to measure the delay of many different combinational logic paths, as long as we ensure that no delay is added by changing the delay block from inverting to non-inverting, that all tri-state buffers driving the test bus 9 have similar delay characteristics, and that the loop is inverting.

Auto-Inverter

Figures 2A, 2B:
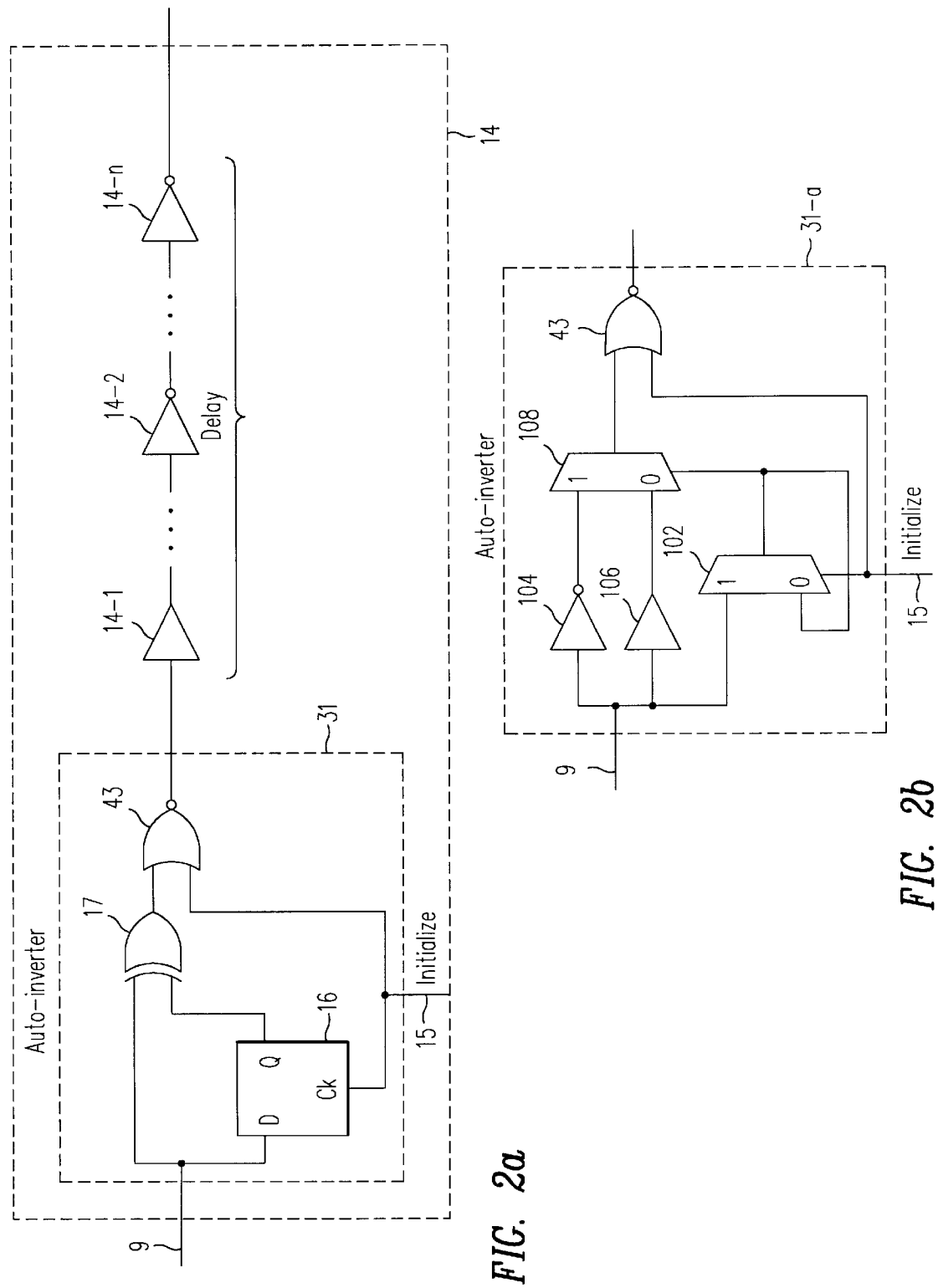
FIGS. 2a and 2b show respectively an example of an oscillation delay and control block containing a circuit for ensuring that the loop delay is inverting, and an alternate implementation of the inverting element.

A delay block circuit 14 which provides the needed delay and ensures that the loop is always inverting is shown in FIG. 2a. Circuit 14 has two modes of operation: when the initialization signal at terminal 15 of flip flop 16 is logic 1, the output signal "auto-inverter" of circuit 31 from NOR gate 43 is logic 0 regardless of any other signal, and when the initialization signal at terminal 15 is logic 0, circuit 31 becomes an inverter if the input signal at wire 9 was a logic 0 when the signal at terminal 15 goes low, or becomes a non-inverter if the input signal at wire 9 was a logic 1 when the control signal at terminal 15 goes low. A more detailed description follows.

During initialization (the signal at terminal 15 is logic 1), assuming a delay path of interest is enabled in the oscillation loop, the output signal of the auto-inverter 31 is logic 0, and this signal propagates around the loop and returns to the wire 9 of the auto-inverter as either a logic 1 or 0 depending on the number of inversions in the oscillation loop. If the input to the auto-inverter is a logic 0, indicating an even number of inversions, then the output of flip flop (level-sensitive latch) 16 causes EXOR gate 17 to be non-inverting with respect to input 9, so that the auto-inverter 31 will be inverting when the initialization signal at terminal 15 becomes a logic 0, thus making the total number of inversions around the loop odd. Conversely, if the input to the auto-inverter had been a logic 1, indicating an odd number of inversions in the loop, then the auto-inverter becomes non-inverting when the initialization signal at terminal 15 becomes logic 0.

The auto-inverter 31 is alternatively implemented as auto-inverter 31-*a* of FIG. 2*b*, using a multiplexer 102 with its output signal fedback to one of its input terminals. The latch including inverters 104, 106 and multiplexer 108 maintains the inverting or non-inverting property of the auto-inverter 31-*a* for as long as the control signal at terminal 15 is logic 0. In summary, during initialization the auto-inverter propagates a steady-state logic 0 around the oscillation loop (not oscillating) and monitors the returning signal. When the signal at control terminal 15 goes low, ending initialization, the auto-inverter becomes an inverter or non-inverter as appropriate to ensure the loop is inverting, and generates a rising edge on node 9 to start oscillation.

Sequential Path Delay

Figure 3:
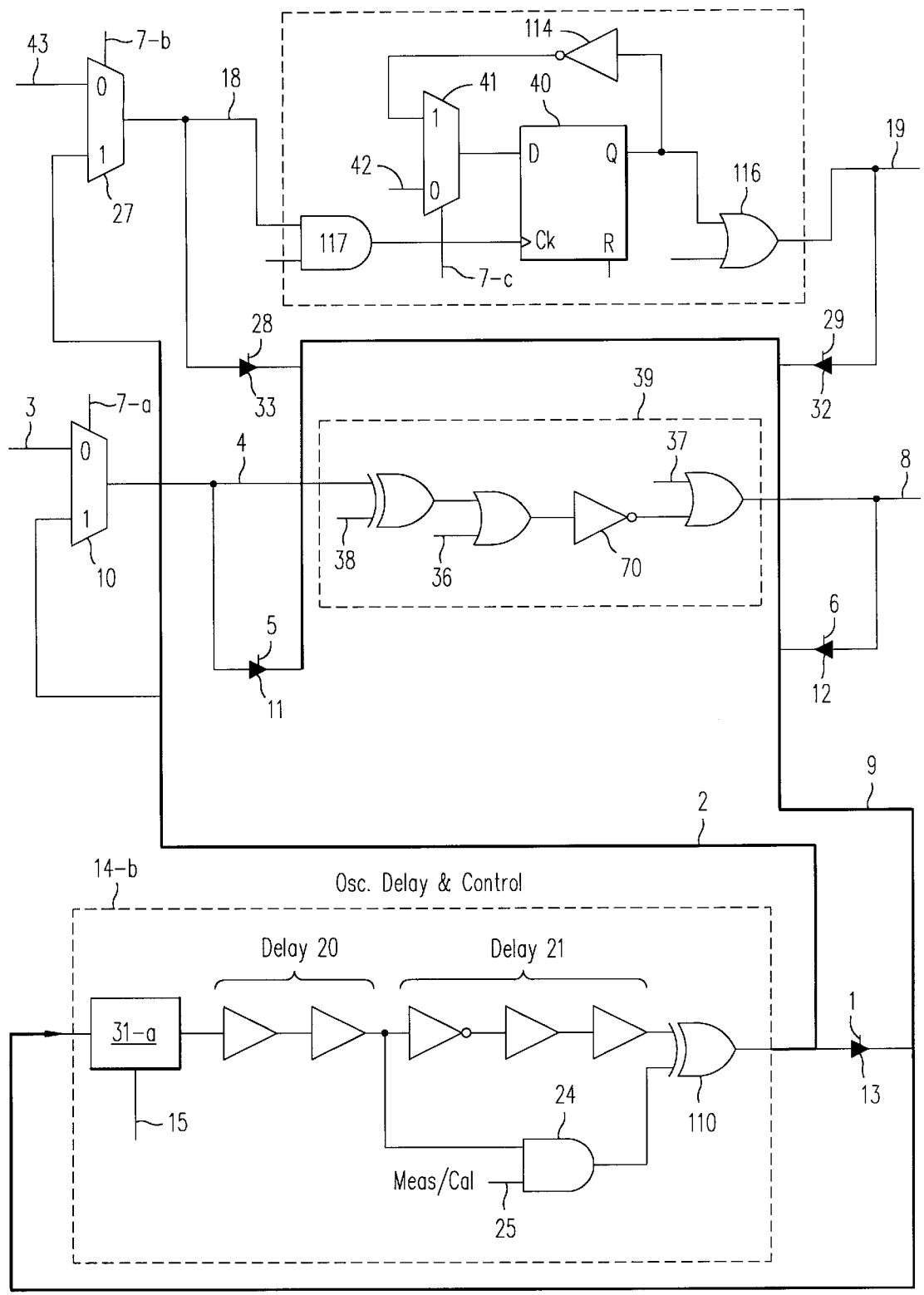
FIG. 3 shows examples of access to combinational and sequential logic delay paths.
Figure 4A:
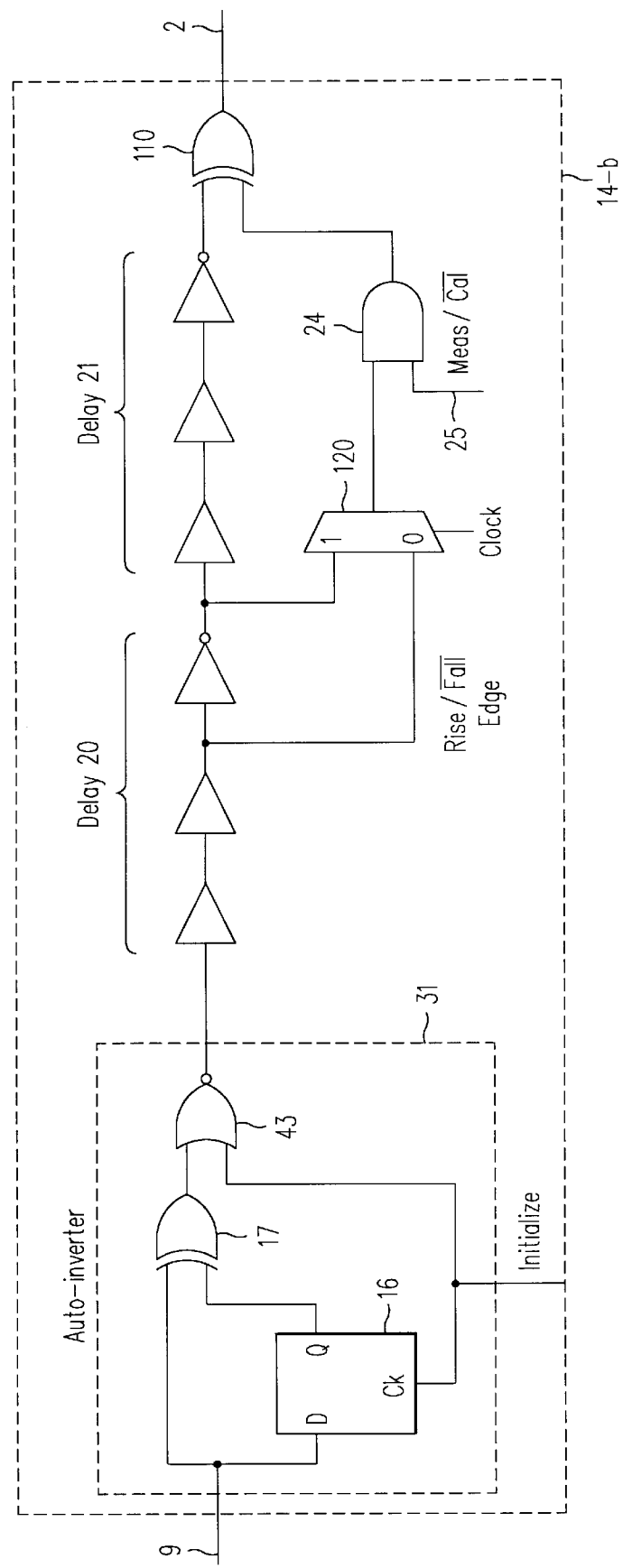
FIGS. 4a, 4b, and 4c show examples of oscillation delay and control blocks for measuring different kinds of delays.
Figure 4B:
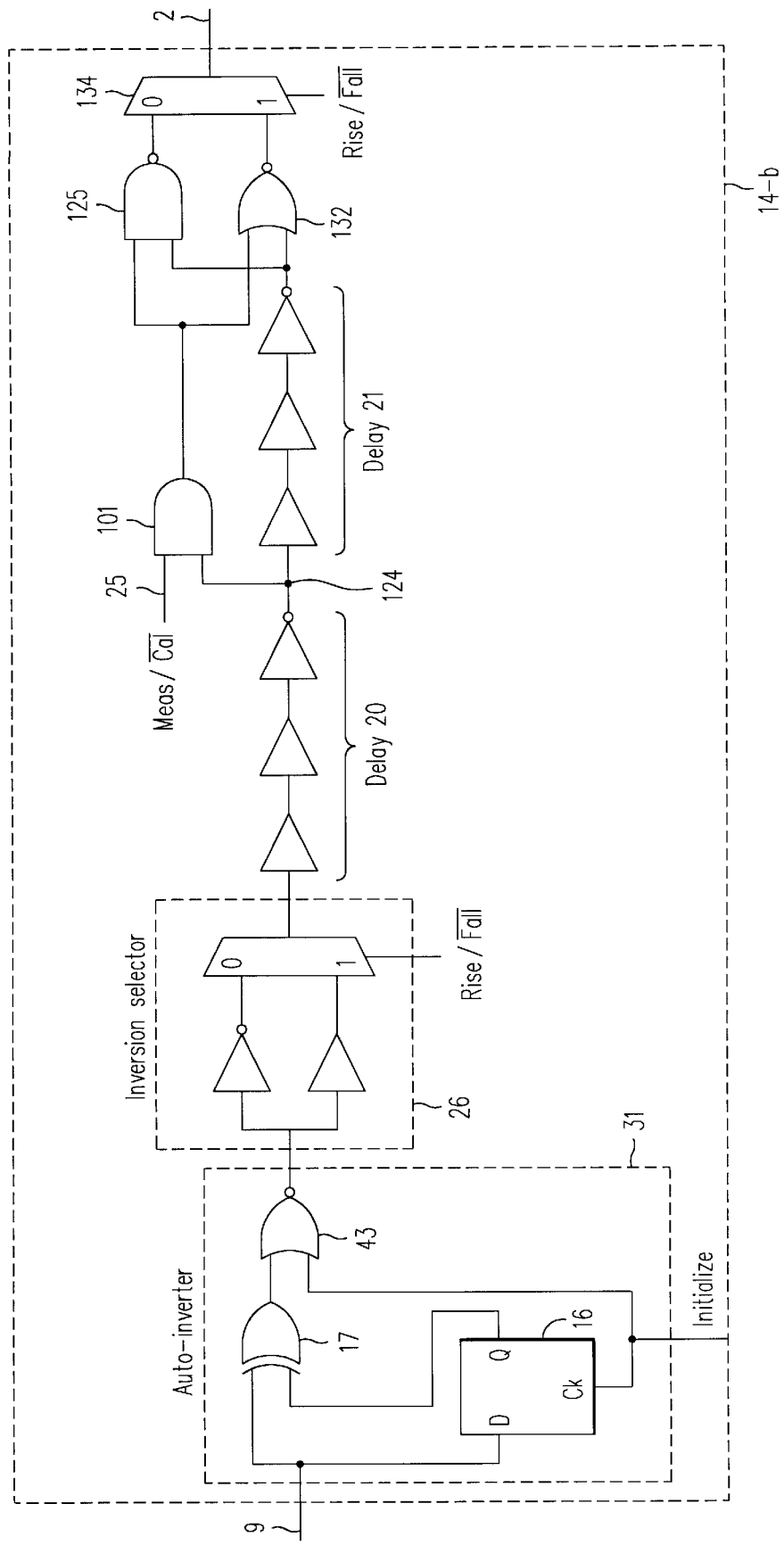
Figure 4C:
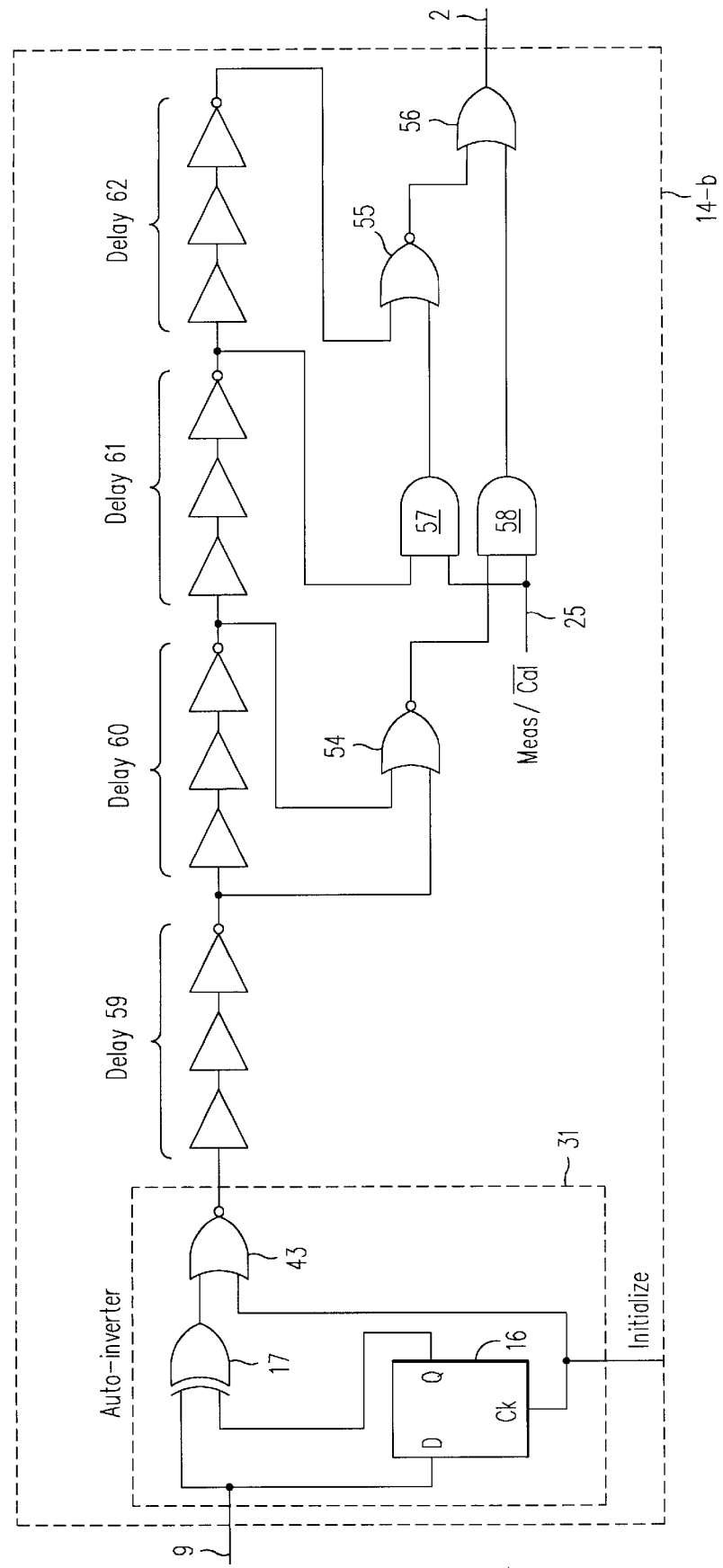

The delay for a path under test which includes a D-type flip-flop 40 can be measured, as shown in FIG. 3, e.g. the delay from when the signal at node 18 rises (from logic 0 to logic 1) when the signal at node 19 rises or falls due to flip-flop 40. To create an oscillation loop, every output transition (rising or falling) from the D-type flip-flop 40 is converted into a pulse which is eventually fed back into the D-type flip-flop's clock input terminal 18. The pulse is obtained using a delay block 14-*b* which includes a delay path with serially connected delays 20 and 21 followed by an EXOR gate 110 (shown in more detail in FIG. 4*a*). FIGS. 4*a*, 4*b*, 4*c* show three alternative versions of delay block 14-*b* of FIG. 3 which is the logical equivalent of circuit 14 of FIG. 2*a*. When measuring the reference oscillation period or the delay of combinational logic paths, as described below, the second input to the EXOR gate 110 is set to logic 0 by AND gate 24.

When measuring a D-type delay path, this second input signal to the EXOR gate 110 is connected (in FIG. 3) to the output terminal of delay 20 via AND gate 24. This creates a conventional pulse generation circuit which responds to every rising and falling edge entering the delay chain 21. The active signal edge must be delayed by the full delay that was evaluated during the reference oscillation (i.e. delay 20 plus delay chain 21, plus the EXOR gate 110, the auto-inverter 31-*a*), whereas the inactive signal edge must only be delayed by delay 20 whose value need not be evaluated, but whose value determines the clock pulse width. The D-type flip-flop 40 being tested has the signal from its Q output terminal inverted and fed back to its D-input terminal through inverter 114 and multiplexer 41, in test mode, so that the flip-flop 40 becomes a divide-by-2 circuit which changes state after every pulse at its clock input.

The above described auto-inverters 31, 31-*a* ensure that an inactive edge followed by an active edge is generated immediately after initialization regardless of the initial state of the D-type flip-flop 40 (it may not be convenient to activate the D-type's reset input). Alternatively, this function is implemented using other logic gates which are enabled or selected by external control signals.

Multiplexer 41 and any other logic gates in the clock input path or Q output path of flip-flop 40 are controlled by a test path sensitizing signal provided by a shift register (not shown) which is different from the normal scan path shift register: the control signal must hold its programmed state in the normal (operating) mode because normal clocking is needed during a delay test of the clock signal to flip-flop 40.

Selecting an inverting or non-inverting tap of delay 21, using the multiplexer 120 in FIG. 4*a*, allows control of the oscillating loop for measuring the rising or falling edge of the clock to any Q transition delay for flip-flop 40. A logic 1 or 0 at the control terminal "Meas/Cal" of gate 24 (and possibly other gates, e.g. gates 57, 58, 101 in FIGS. 4*b*, 4*c*) selects, respectively, whether sequential or combinational/calibration logic delays are to be tested. The user thereby determines by the control signals to block 14 what type of delay path is to be tested. Gates 116 and 117 represent any logic gates which are part of the delay path under test and which are suitably enabled in test mode.

Combinational Path Rise and Fall Delays

The rise and fall delay through a combinational logic path under test has thus far been assumed equal: the delay measured is actually the average of the rise and fall delays, since each oscillation period contains a rising and a falling edge. If the separate values of rise and fall delays are to be measured, then the delay block circuit 14-*b* shown in FIG. 4*b* can be used. For each rising (or falling) edge at the input 9, a pulse is generated of appropriate polarity to ensure an inverting loop delay. Only the second (trailing) edge of the pulse is accurately timed relative to the reference oscillation period. The first edge is created by tapping the delay chain at a node 124 between delay 20 and delay 21, and its timing is not important but it should be chosen to ensure that all edge spacings exceed the minimum pulse width that can be handled by the circuit under test. The oscillation period is determined by the sum of the delay through the delay and control circuit 14-*b* plus the delay from the appropriate edge on bus wire 2 through the Delay Under Test to the rising (or falling) edge on bus wire 9. In FIG. 4*b*, inverting delay 21 and NAND gate 125 generate a pulse in response to a rising signal edge on node 124; inverting delay 21 and NOR gate 132 generate a pulse in response to a falling signal edge; and multiplexer 134 selects which edge type the delay block 14-*b* is responsive to, as controlled by the user.

Sequential Path Rise and Fall Delays

In the above cases, for sequential logic, the output rising and failing delays are assumed to be equal: the average value is measured. The delay from an active input edge to an output falling or rising (but not both) can also be determined. For example, to measure the delay from input rising to output falling for a sequential circuit, the delay block circuit 14-*b* shown in FIG. 4*c* may be used. The delay and control block 14-*b* generates two pulses at its output wire 2 for every falling edge at its input wire 9 (rising input edges are ignored); the last edge of the four generated is rising. Thus only the sequential path's output falling edge delay affects the oscillation frequency. Similarly, a circuit can be constructed which generates two pulses for only rising edges at input wire 9, by substituting NAND gates for the NOR gates 54, 55 and making Delay 59 non-inverting. Inverting the output signal at wire 2 allows testing of circuits responsive to falling edges. In FIG. 4c, when AND gates 57, 58 are disabled by a logic 0 on the Meas/Cal input 25, the delay block 14-b is a simple delay as previously described for FIG. 1. When the input 25 is logic 1, then as a single edge progresses through the inverting delays 59–62, it causes two pulses to be generated at the output terminal 2 of gate 56.

Multiple D-type Flip-Flops in Series

For sequential circuits which contain a second D-type flip-flop which is clocked by a first D-type flip-flop which is in turn clocked by an input signal, the average rise and fall delay can be determined by converting each output signal edge of the second D-type flip-flop into two pulses. This is done similarly to the circuit shown in FIG. 4c, by substituting EXOR gates for the NOR gates 54, 55 and OR gate 56 (the AND gates 57, 58 are enabled or removed). In all cases, only the final edge of each pulse pair is critically timed relative to the calibration path, and the EXOR gates are designed to have constant delay regardless of whether they are inverting or non-inverting. Any number of flip-flops connected in series can be tested by ensuring that sufficient pulses are generated so that each output transition of the last flip-flop in the chain causes another output transition.

Waveforms and Delay Calculations

Figure 5A:
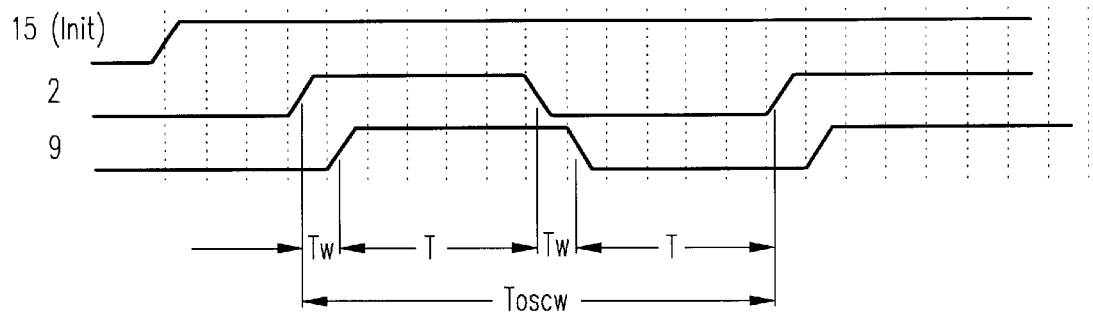
FIGS. 5a, 5b, and 5c show oscillation waveforms used in conjunction with the circuitry of FIG. 3.
Figure 5B:
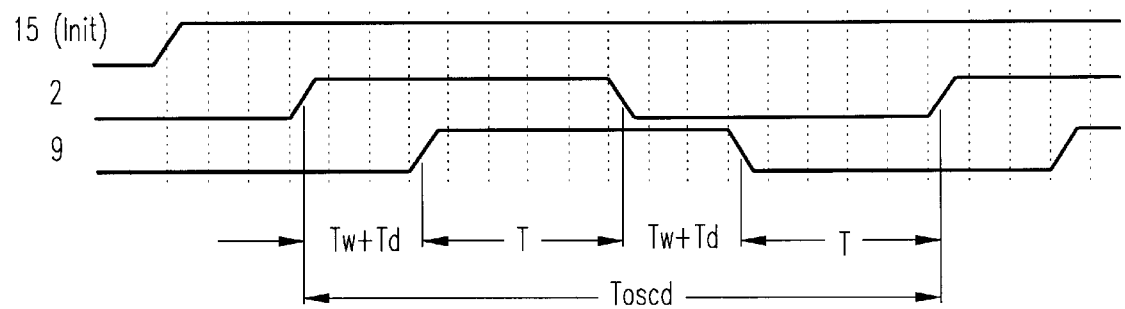
Figure 5C:
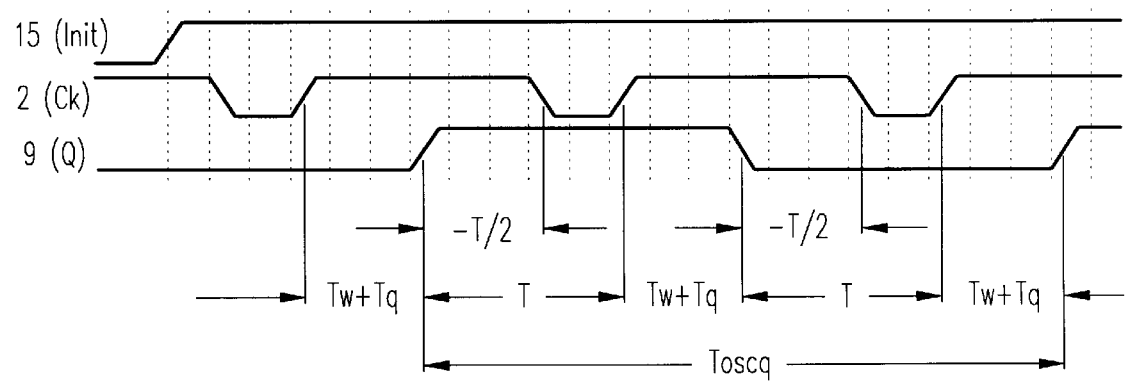

FIGS. 5a, 5b, and 5c show oscillation waveforms for the circuit of FIG. 3. The numbers next to waveforms in these figures refer to the similarly numbered nodes in FIG. 3 and hence denote the waveform at that circuit node.

Tw is the "wire" delay; this is the delay once through the entire length of wires 2 and 9, including the delay through the multiplexer 10 driving the capacitance of connected node 4, and through the buffer 11 driving bus 9.

T is the unknown but constant delay through the Oscillation Delay and Control Block 14-b.

Td is the unknown delay through the Delay Under Test whose input is the node (e.g. node 3) driven by the above-mentioned multiplexer. In this example, Td is the same for rising and falling signals.

Reference Delay

In FIG. 5a, waveforms are shown for the case where enabling signals on lines 5 and 7-a are logic high, and enabling signals 1 and 6 are logic low. The oscillation period is twice the delay around the loop including block 14-b, bus wire 2, multiplexer 10, buffer 11, and bus wire 9. The delay around the loop is Tw+T, and Toscw=2*(Tw+T).

Combinational Delay

In FIG. 5b, waveforms are shown for the case where enabling signals on lines 6 and 7-a are logic high, and all other buffers connected to bus wire 9 are disabled. The oscillation period is now twice the delay around the loop comprising block 14-b, bus wire 2, multiplexer 10, the Delay Under Test, buffer 12 (whose drive is as equal as possible to that of every other buffer driving bus wire 9), and bus wire 9. The delay around the loop is Tw+T+Td, and Toscd=2*(Tw+T+Td).

By subtracting the oscillation period in FIG. 5a from that in FIG. 5b, and dividing by 2, the value of Td is obtained: Td=(Toscd−Toscw)/2.

Sequential Delay

In FIG. 5c, Tq is the delay from the active (rising) edge of the signal on node 18 to the resultant output signal transition on node 19, for the case where sequential logic (a D-type flip-flop) is the Delay Under Test. In this case, enabling signals on lines 7-b, 7-c, and 29 are logic high, and all other buffers connected to bus wire 9 are disabled. Each signal transition entering block 14-b initiates a pulse at the block 14-b output, starting with an inactive edge at a time approximately T/2 later, and finishing with an active edge at a time exactly T later. Similarly to the combinational case, the oscillation period is now twice the delay around the loop comprising block 14-b, bus wire 2, multiplexer 27, the Delay Under Test, buffer 32, and bus wire 9. The delay around the loop is Tw+T+Tq, and Toscd=2*(Tw+T+Tq). This oscillation signal is monitored on bus wire 9, because the oscillation signal on bus wire 2 will have twice the frequency of the signal on wire 9 (one pulse on wire 2 for every edge on wire 9).

By subtracting the oscillation period in FIG. 5a from that in FIG. 5c, and dividing by 2, the value of Tq is obtained: Tq=(Toscq−Toscw)/2.

Minimum Reference Delay

Electronic signals travel at approximately half the speed of light, which travels 30 cm/ns. Some current ICs are larger than 1.25 cm on a side, which is 5 cm around the periphery, so the time to travel this distance is approximately 0.4 ns. If this time inaccuracy is not tolerable, the time to travel around the IC can be calibrated. For these ICs, i.e. where the delay due to transmission line effects through the bus wires 2 and 9 is significantly longer than through a single buffer, greater accuracy is possible by separately measuring delay Tm. Tm for the circuit in FIG. 3 is the minimum delay: directly through a buffer 13 which is physically located as close as possible to the oscillation delay and control block 14-b. The oscillation period, in this case, is Toscm=2*(T+ Tm). If e.g. the delay path of interest is located at a point which requires the signal to travel 73% of the total wire length, then the corrected value for Td is calculated as follows: Tw=(Toscw−Toscm)/2; Td=(Toscd−Toscw)/2− 0.73*Tw; similarly $$Tq=(Toscq-Toscw)/2-0.73*Tw.$$

Tri-State Enable Path Delay

Figure 6:
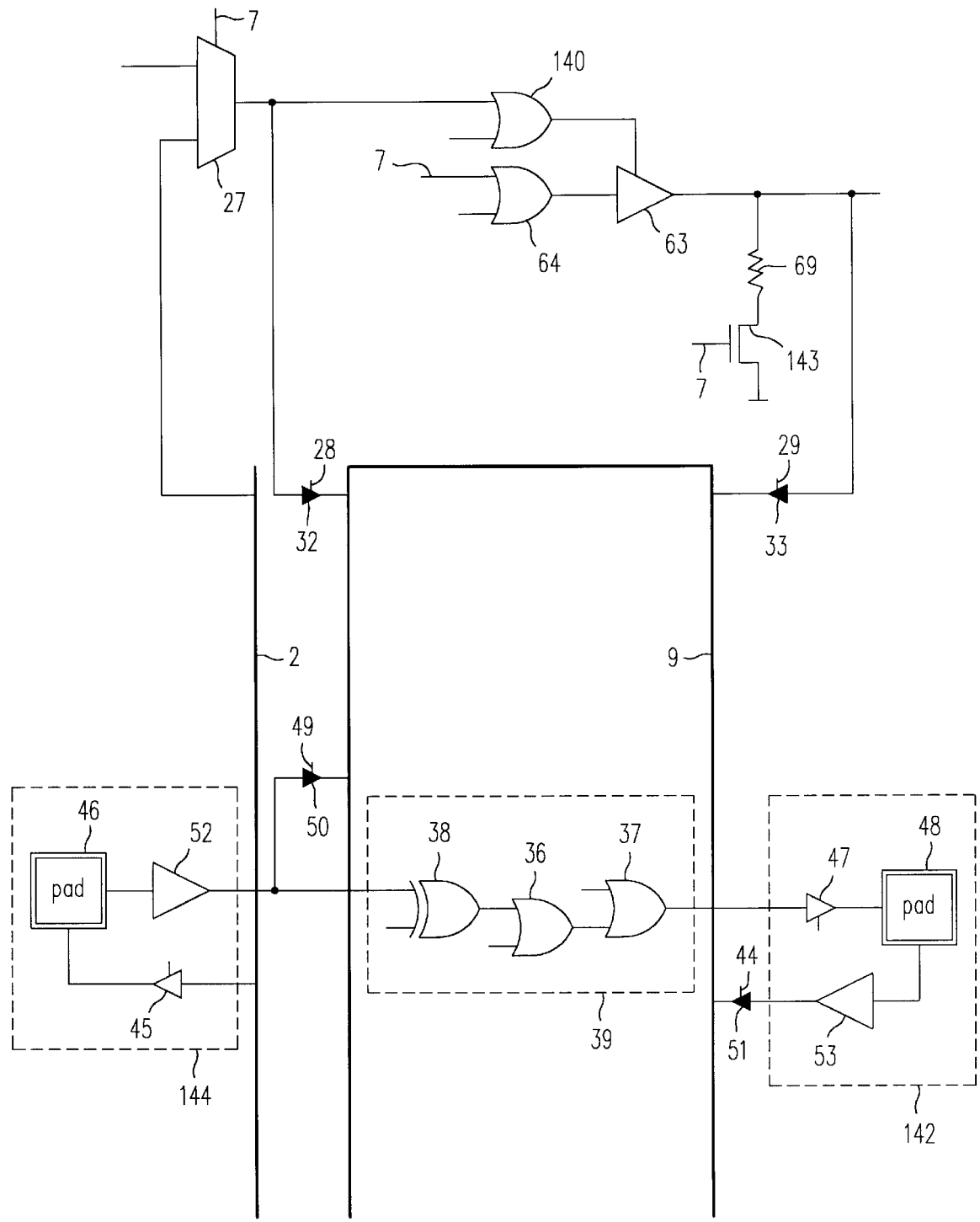
FIG. 6 shows examples of access to tri-state driver enable delays and pin-to-pin delays.

FIG. 6 shows how the enable path delay for a tri-state buffer 63 is measured. A suitable low-impedance pull-up or pull-down path including e.g. resistor 69 and transistor 143 is enabled on the tri-state output, during test mode, and a logic low or high, respectively, is applied to the data input 64 of the tri-state buffer 63. The impedance is suitably low if it causes the output signal of the tri-state drive 63 to change from logic 0 to logic 1 faster than the delay through the oscillator delay block 14. For a logic-high enabled buffer, the output-enable delay is measured from the rising edge of the enable signal to the output transition time. Similarly, the output-disable time is measured from the falling edge of the enable signal to the output transition time.

Pin-to-Pin Path Delay

Measuring the delay from an input pin of an IC to an output pin requires a different access method, partly because the delay of interest is from the IC's pin itself, partly because inserting a multiplexer in a critical path may not be acceptable (e.g. the master clock input), and partly because it is possible to simply disconnect the normal input signal off-chip. FIG. 6 shows an example of a circuit for accessing the pin-to-pin delay. In fact, only access to the bonding pad is possible (i.e. not to the package pin): a bonding pad is the metal area to which a wire from the IC package pin is mechanically bonded. The method of measuring this delay is now described.

First, a reference path delay is measured, including bus wire 2, pin driver 45, the input pad 46, pin input buffer 52, buffer 50, bus wire 9, and the oscillation delay block 14 (not shown, for simplicity). Element 46 is the input "pin". The elements within outline 144 are typically located as close as possible to one another; similarly, the elements in outline 142. The inclusion of pin input buffer 52 is optional: typically the pin input buffer is specially designed to accept low amplitude signals such as TTL or ECL signals, and its drive will not match the other tri-state buffers which drive bus wire 9, and so buffer 50 monitors the output of this special input receiver 52. If the pad signal is a conventional CMOS signal, then the input of buffer 50 could be connected directly to the pad.

Next, the pin-to-pin path delay is measured, including bus wire 2, pin driver 45, the input pad 46, pin input buffer 52, the delay path through the middle of the IC (circuit 39) with all its logic gates 36, 37, 38 suitably enabled, the output pin driver 47, the output pad 48, the input pin buffer 53 (again, optional), the tri-state buffer 51, bus wire 9, and the oscillation delay block 14. Element 48 is the output "pin".

If the optional pad signal input buffers are excluded, then the only difference between the reference path delay and the pin-to-pin path delay is the delay added by the path from the input pad to the output pad, and this difference can be measured as previously described for combinational and sequential logic paths. If the optional pin buffers are necessary, then the delay of buffer 53 minus the delay of buffer 52 will be included in the measurement result.

Use of the P1149.4 Standard Test Bus

The two analog bus wires (conductors) AB1 and AB2 specified in the proposed IEEE P1149.4 Mixed-Signal Test Bus standard can be used as wires 2 and 9 of FIG. 6. Thus a single pair of wires provides direct access to the pins for P1149.4 capabilities (such as measurement of off-chip components and pin DC parameters) and for use in delay measurement.

IC-to-IC Path Delays

Figure 7A:
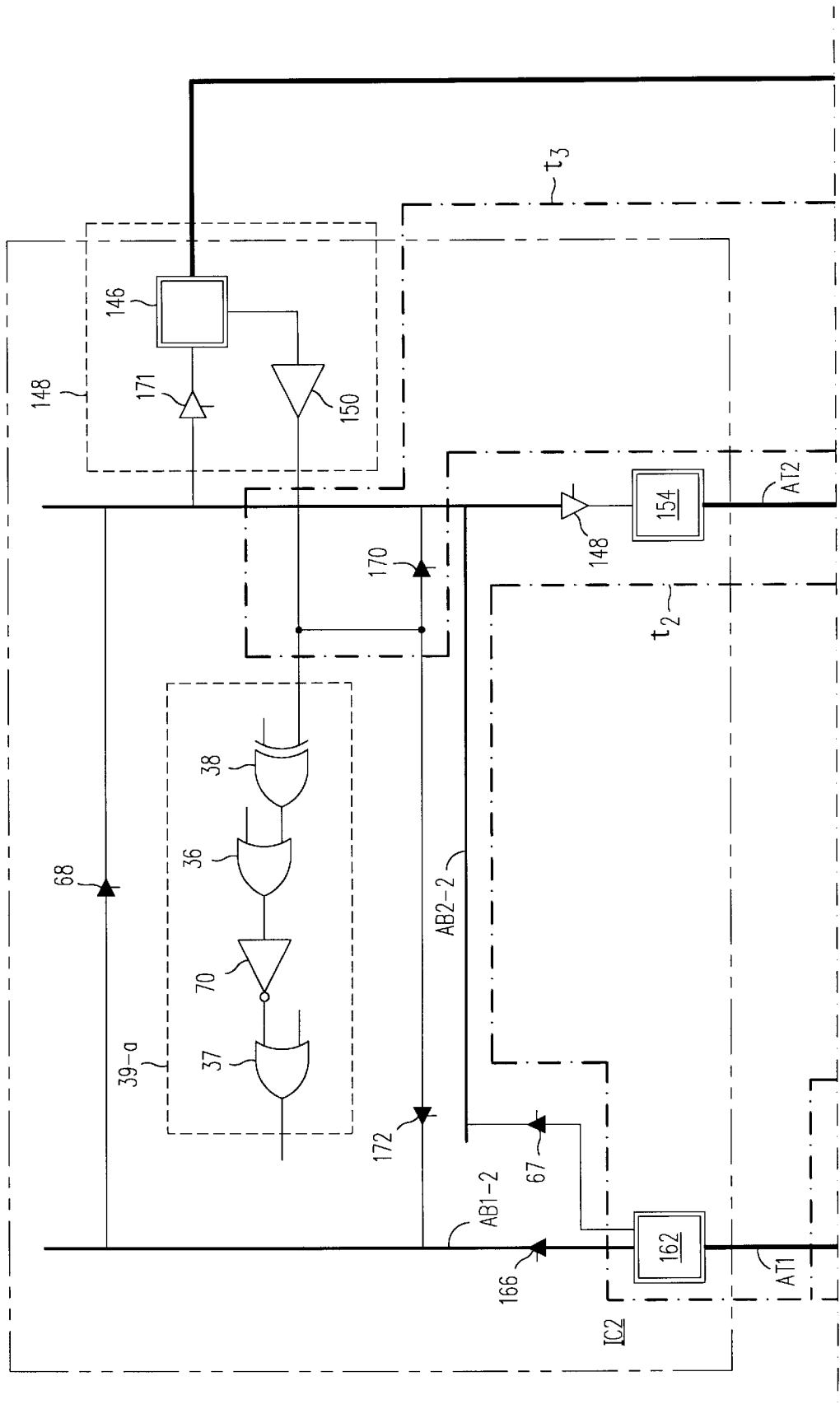
FIG. 7 shows two interconnected ICs with test circuitry in accordance with the invention.

One intent of the P1149.4 proposed standard bus is that several interconnected ICs on a printed circuit board (PCB) have this bus, and several ICs on the board are connected to the same pair of analog bus wires on the PCB, thus facilitating simpler, centralized analog test access. This same infrastructure can be used in accordance with this invention to measure delay between ICs, as shown in FIG. 7. The conductors AB1 and AB2 of the first IC, IC1, are connected via on-chip switches to the test bus conductors AT1 and AT2 respectively, and several ICs (IC1, IC2) on a PCB are connected to the AT1, AT2 test bus. Thereby it is possible to extend the oscillating loop already described, to include the test bus on IC2. The following method measures an IC-to-IC delay for two interconnected ICs, IC1 and IC2; only the relevant portions of IC1, IC2 are depicted.

1. Using the method previously described, determine the on-chip delay, t1, by forming an oscillation loop (shown by the broken line t1) including (in series) the output terminal of oscillation delay block 14 directly driving (by passing tri-state buffers 13-1, 13-2) tri-state buffer 45, pad 46, tri-state buffer 52-a, conductor AB1, the on-chip multiplexer 65, the IC1 delay path of interest 39, tri-state buffer 47, IC1 output pad 48 of interest (connected to IC2 via PCB wire/path 66), buffer 53-a, tri-state buffer 160, conductor AB2 of IC1, and returning to the input terminal of the oscillation delay block 14.

2. Determine the delay t2, due to the conductors AT1 and AT2 alone, by forming an oscillation loop (broken line t2) including (in series) the output terminal of oscillation delay block 14 directly driving pad 46 via tri-state buffer 45, AT1, tri-state buffer 67 on IC2, conductor AB2-2 of IC2, buffer 148, pad 154, conductor AT2, pad 156, tri-state buffer 158, conductor AB2 of IC1, and the input terminal of oscillation delay block 14.

3. Alternatively, determine the delay t2a (not shown), due to the conductors AT1 and AT2 alone, by forming an oscillation loop including the output terminal of the oscillation delay block 14 of IC1 driving pad 46 via tri-state buffer 45, AT1, pad 162, tri-state buffer 166, conductor AP1-2 of IC2, tri-state buffer 68 between AB1-2 and AB2-2 of IC2, conductor AB2-2 of IC2, tri-state buffer 148, pad 154, AT2, pad 156, tri-state buffer 158, conductor AB2 of IC1, and the input terminal of oscillation delay block 14.

4. Determine the delay t3 (broken line t3), which includes the off-chip path of interest, by forming an oscillation loop including the output terminal of oscillation delay block 14 of IC1 driving pad 46 via tri-state buffer 45, tri-state buffer 52-a, conductor AB1 of IC1, multiplexer 65, the IC1 delay path of interest 39, tri-state buffer 47, pad 48, the board level interconnect 66 (which may include digital or analog components), the input pad 146 of IC2, buffer 150, a tri-state buffer 170, conductor AB2-2 of IC2, tri-state buffer 148, pad 154, conductor AT2, pad 156, buffer 158, conductor AB2 of IC1, and the input terminal of oscillation delay block 14.

5. Alternatively, determine the delay t3a, by forming an oscillation loop (not shown) including the output terminal of the oscillation delay block 14 of IC1 driving the pad 46 via tri-state buffer 45, AT1, pad 162, tri-state buffer 52-a, conductor AB1 of IC1, multiplexer 65, the IC1 delay path of interest 39, tri-state buffer 47, pad 48, the board level interconnect 66, the input pad 146 of IC2, buffer 150, a tri-state buffer 172 to conductor AB1-2 of IC2, a tri-state buffer 68 between AB1-2 and AB2-2 of IC2, conductor AB2-2 of IC2, tri-state buffer 148, pad 154, conductor AT2, pad 156, tri-state buffer 158, conductor AB2 of IC1, and the input terminal of oscillation delay block 14.

6. Delays which can now be calculated are: t3−t2 (or t3a−t2a) is the delay from multiplexer 65 on IC1 to the input pin 146 of IC2; t3−t2−t1 (or t3a−t2a−t1) is the delay from the IC1 output pin 48 to the IC2 input pin 146.

Set-us and Hold Time Measurement

The set-up time for a sequential logic path is the latest possible time that the data can arrive, relative to the clock signal, prior to being latched by a D-type flip-flop. The hold time is the latest possible time, relative to the clock, that the data must be valid after it is latched by a D-type flip-flop. Typically, the set-up and hold times are equi-distant in time either side of the point of metastability, i.e. the data arrival time for which the flip-flop's output would be indecisive and enter a metastable state between logic high and low. Because many delays contribute to set-up and hold times, the most reliable way to measure these times is to systematically increase the delay of data with respect to the active edge of the clock signal to the flip flop, until the correct data value is no longer latched. All data arriving sufficiently before this time point will meet the set-up time, and all data arriving sufficiently after this time will meet the hold time. Data arriving between these two time points might cause metastable behavior in the flip-flop.

Figure 8:
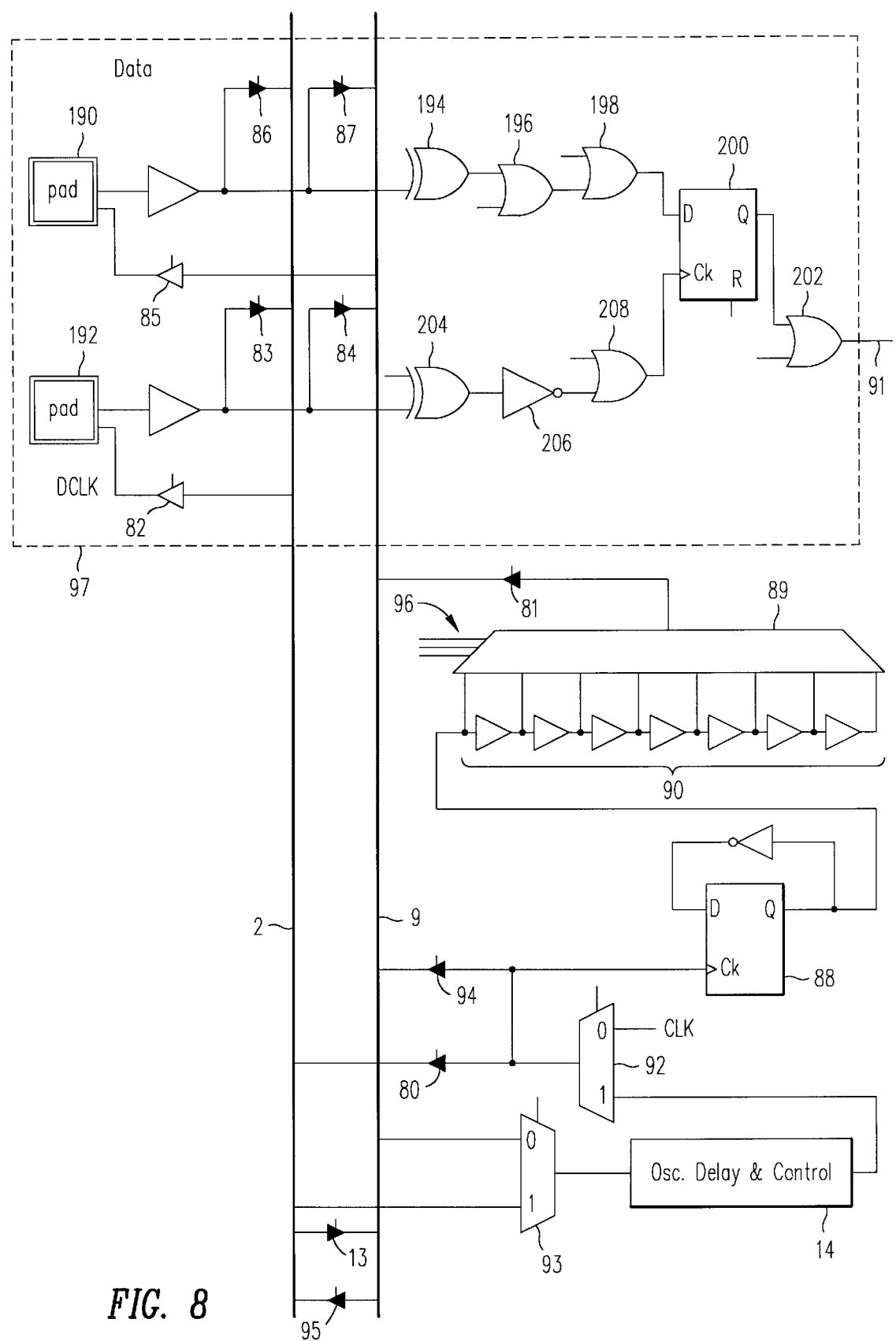
FIG. 8 shows an example of circuitry to determine the set-up and hold time of sequential logic, as would be measured at the pins of an IC.

A circuit which can accomplish this measurement is shown in FIG. 8. A delay line of inverters or buffers 90 is tapped at regular intervals by a multiplexer 89, whose control inputs 96 are connected to a binary counter or shift register (not shown). Data intended for the sequential circuit 97 under test is routed through the delay chain 90, through multiplexer 89, a buffer 81, the bus wire 9, and a buffer 85, to the data input pad 190 (which must be electronically disconnected from any off-chip driver) of the sequential circuit 97. The clock signal for the circuit under test 97 (elements 194–208) is routed via a multiplexer 92, a buffer 80, the other bus wire 2, and a buffer 82 to the clock input pad 192 (which must be electronically disconnected from any off-chip driver) of the sequential circuit 97. All logic gates in the clock and data paths of the circuit under test 97 must by appropriately enabled as previously described for combinational logic delay measurement.

The data can be derived from the clock signal divided by two (or four if set-up or hold time is greater than half a clock period) via a flip-flop 88 triggered by the inactive edge of the clock signal CLK. The binary counter controlling the multiplexer 89 could be clocked by the data signal. Each time the data signal falls, the counter increments, and the delay line tap, selected via multiplexer 89, is shifted by one. Each time the data rises, the output 91 of the sequential circuit under test is compared to the expected value at the appropriate time, e.g. one clock cycle later. If the output value is correct, the binary counter is permitted to increment upon the arrival of the next data signal falling edge. This linear search procedure continues until the output value is incorrect, then the counter input is disabled.

When the output value is incorrect, the delay line's delay, tData, is measured using the method previously described for measuring sequential logic delays, for the path through a multiplexer 92, the divide-by-two flip-flop 88, the tapped delay line 90, the multiplexer 89, a buffer 81, the bus wire 9, a buffer 85, the data pad 190 (DATA), a buffer 86, the second bus wire 2, and a multiplexer 93. Next the clock path delay, tClk is measured, as described for combinational logic delays, for the path through the multiplexer 92, the buffer 80, the bus wire 2, the buffer 82, the clock pad 192 (DCLK), a buffer 84, the second bus wire 9 and the multiplexer 93. The difference between the two delays, tData−tClk, is equal to the time that data was delayed following the inactive clock edge; this time corresponds, within the resolution of the time increments of the delay line 90, to the time point of metastability. If this time is subtracted from half the clock period used for this test, we get the set-up time (which can be negative), which is also the negative of the hold time.

The set-up and hold measurement can be more accurate if the delay error due to bus wire 9 being used to monitor the delay to DCLK, and bus wire 2 being used to monitor the delay to DATA, is determined. Reference paths can be measured using buffer 13 and then buffer 95 to measure the delay in one direction (oscillation delay block 14 driving the first bus wire 2, as done in previous examples, and monitoring via the second bus wire 9), and then measuring the delay in the opposite direction (block 14 driving the second bus wire 9, and monitoring via the first bus wire 2).

Analog Path Delays

Figure 9A:
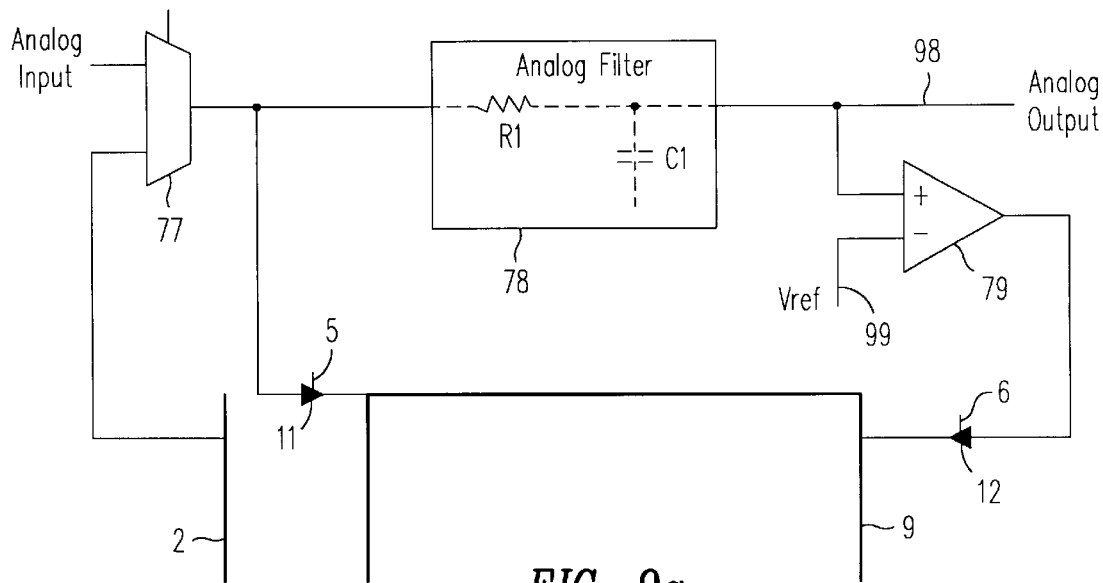
FIG. 9a shows an example of access to analog circuitry.

The delay measurement techniques described above do not just apply to measuring the delay of digital circuits. As shown in FIG. 9a, a digital signal (of reduced amplitude if necessary) can be applied to an analog circuit 78 (here a filter having elements R1, C1), and the output signal at terminal 98 of the analog circuit 78 can be converted to a digital signal using a comparator 79. If it is ensured that the circuit 78 has fully responded to any previous transitions each time a new transition is applied (i.e. settled to a steady state value), then the response time will be identical each time, as it is for a digital circuit.

For a first order filter, such as the simple RC filter 78 as shown, the time to settle to within 1% of the final value is 5×R1×C1, where R1 is the value of the resistance R1 (in ohms) and C1 is the value of the capacitance C1 (in farads). This means that the delay through the oscillation delay block 14 must be greater than 5R1C1. For a filter with 10 kHz bandwidth, 5R1C1 is equal to 80 microseconds. This length of time cannot be economically achieved using a chain of inverters in modern CMOS processes. Instead, a simple logic circuit, such as a binary counter can be used. The counter's delay (e.g. 256 clock cycles) will have a resolution equal to the clock period, but for a 10 MHz clock (100 ns period), this is sufficient to measure 10 kHz bandwidth filters (50% rise time=12 microseconds) to 1% accuracy.

Figure 9B:
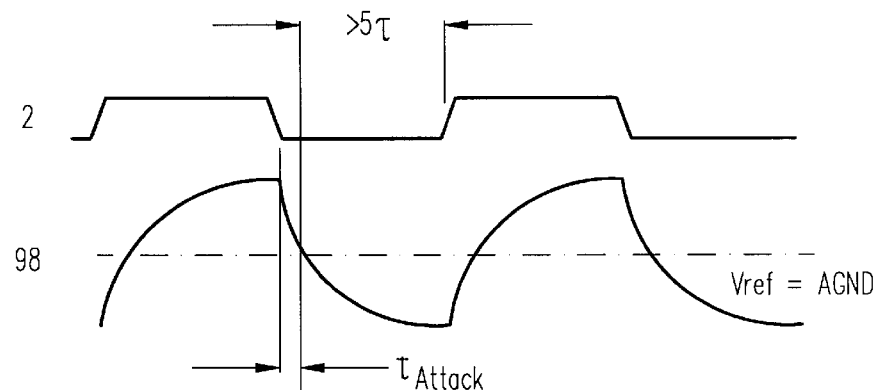
FIGS. 9b, 9c show related waveforms with indication of when delays would be measured for respectively a low pass filter and a high pass filter.

For low pass filters, the delay of the leading edge, sometimes called the "attack" time, is proportional to R1C1 and the filter's gain as shown in FIG. 9b. The steady-state or settled value after each transition, is determined by the DC gain of the filter and the value of the input. FIG. 9b shows waveforms for signals at nodes 2, 98, and 9 of FIG. 9a, as labelled, for a low pass filter 78. To minimize sensitivity to the Vref 99 voltage used by the comparator 79, Vref should be the mean output value. The delay from each input rising (or falling) edge to the immediately consecutive output edge, will be proportional to the filter's bandwidth and gain, and can detect many analog faults. This delay can be measured as previously described for a combinational path delay.

Figure 9C:
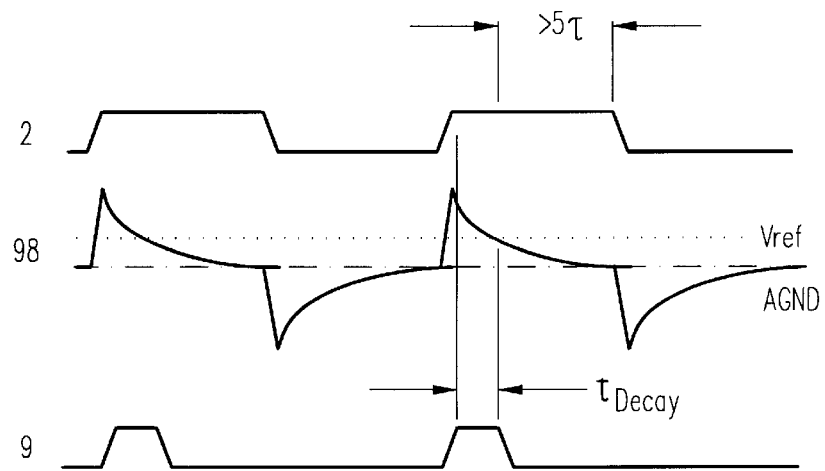

For high pass filters as shown in FIG. 9c, the analog output signal will attack almost instantly to a value determined by the high frequency gain, and then decay at a rate proportional to the filter's bandwidth, until it settles at the mean output value. FIG. 9c shows waveforms for signals of nodes 2, 98, and 9 of FIG. 9a for a high pass filter 78. A suitable reference voltage for the comparator 79 is mid-way between the expected maximum output value and the mean output value. The delay from each input rising edge to the second consecutive output edge (e.g. falling edge, for a non-inverting filter), will be proportional to the filter's bandwidth and gain, and can detect many analog faults. If the output waveform is first used to clock a D-type flip-flop which is (for this example) falling edge active, then the analog filter delay can be measured as previously described for a sequential path delay.

Delay Copying

Figure 10:
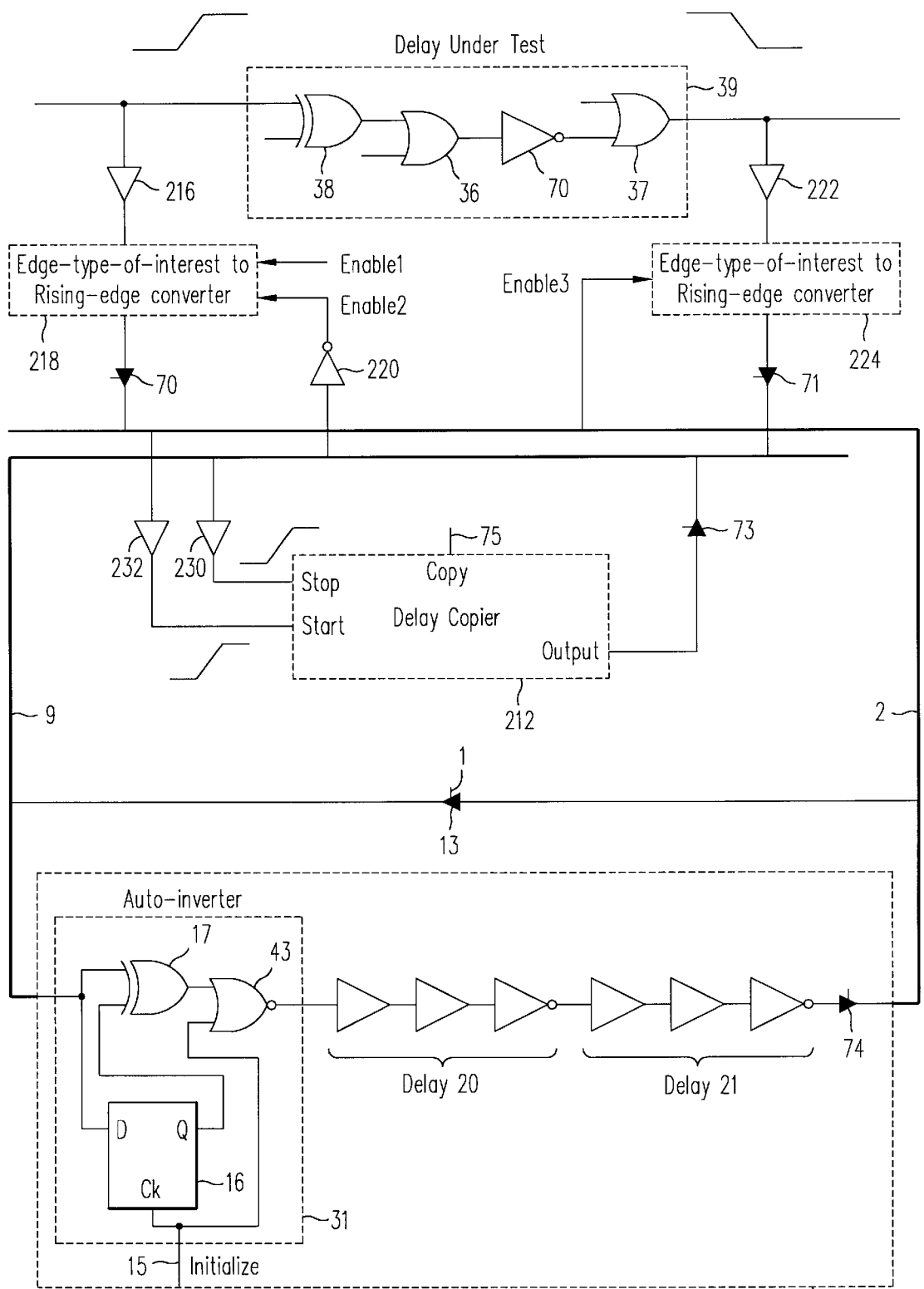
FIG. 10 shows circuitry for delay copying.

A circuit is shown in FIG. 10 for measuring delay without requiring the insertion of a multiplexer in the delay path, and without requiring the delay path to be incorporated into an oscillator. A circuit 212, called herein a "delay copier", is programmed to have the same delay as the delay path being monitored. It does so in a single conversion, and does not require continuous access or averaging. The delay of the delay copier 212 is then measured using oscillation as previously described for combinational logic delays.

A signal edge at the input terminal to the delay path under test 39 causes detector 218 to generate a rising edge on bus 2, via enabled tri-state driver 70. This rising edge is detected by the delay copier 212, which starts an internal process described later Eventually, the delay path under test generates an output edge which causes detector 224 to generate a rising edge on bus 9, via enabled tri-state driver 71. This rising edge is detected by the delay copier 212 via buffer 230, and the internal process is stopped. Next, control input 75 changes the mode of the delay copier so that subsequent edges detected via buffer 232 cause a suitably delayed output edge to be generated via buffer 73. Lastly, this delay is measured using block 14c and the oscillation technique previously described.

The circuitry will now be described in more detail. To copy a delay, three circuit blocks are needed: a delay start detector 218, a delay stop detector 224, and a delay copier 212. There are three possible types of start and stop conditions: a signal rising, a signal falling, and a signal rising or falling. A different circuit is need for each condition, as shown in respectively FIGS. 11a, 11b, 11c. Each circuit drives a bus wire (2 or 9) high when its input condition is detected, and all three circuits 250, 260, 262 are designed to have identical delays. Complex start and stop conditions can be accomplished: in addition to a certain edge type, each detector also requires the signals on its two other input terminals 252, 254 to be logic high. One input signal on terminal 254 driving gate 253 for a stop detector would typically be from the other bus, i.e. indicating a delay has been started. Another typical input signal at terminal 252 enabling tri-state buffer 255 for both starting and stopping would be a register control bit to indicate that a particular path delay is to be measured. Another possible input signal (inputs can be further ANDed) to generate the signal at terminal 252 would be a logic state (e.g. a counter output= 11011 and another signal is low).

Figure 11A:
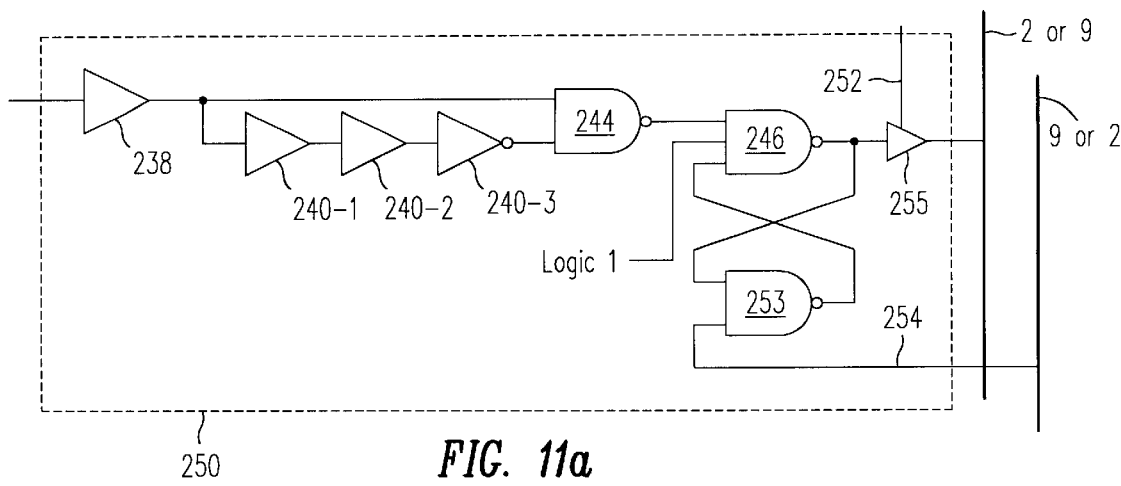
FIGS. 11a, 11b, 11c show examples of a family of three types of edge converters having approximately equal delay.

FIG. 11a shows a circuit which responds to rising edges at the input to buffer 238 and includes an input buffer 238 driving delay chain 240-1, 240-2, 240-3, coupled to NAND gate 244 which in turn drives NAND gate 240 along with "logic 1" and cross-coupled NAND gate 254. The tri-state buffer 255 enabled by line 252 drives wires 2 or 9.

Figure 11B:
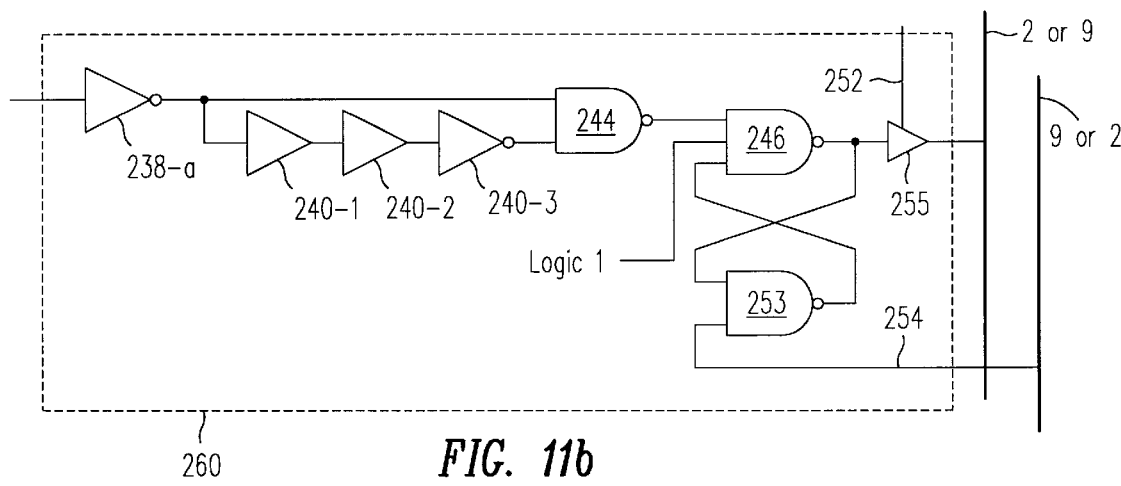
Figure 11C:
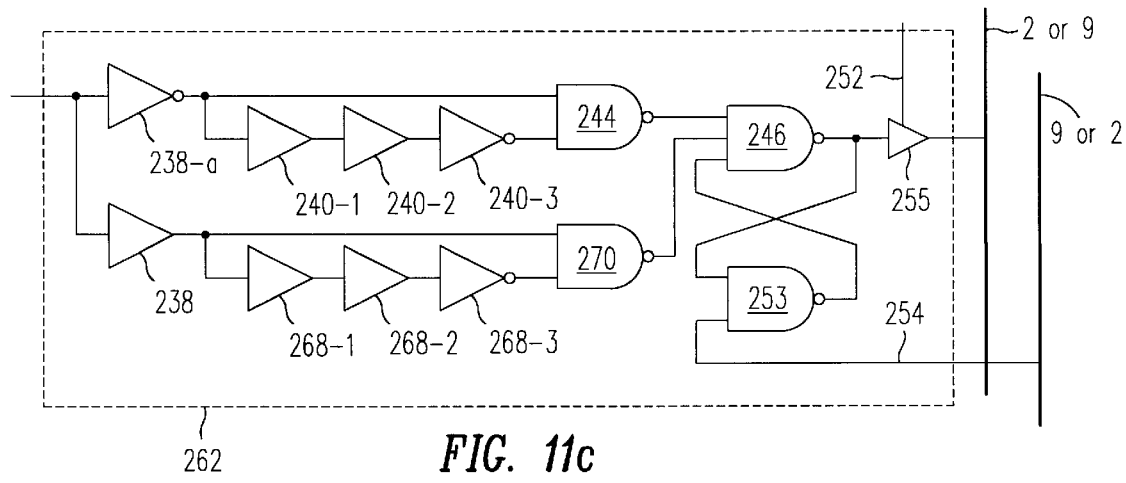

Circuits 260, 262 shown respectively in FIG. 11b, lic are modifications of circuit 250. In circuit 260, buffer 238 of circuit 250 is replaced by inverter 238-9 so as to make the circuit responsive to falling edges at the input terminal to inverter 238a. In circuit 262 of FIG. 11c, buffer 238 drives delay chain 268-1, 268-2, 268-3 coupled to NAND gate 270 replacing the "logic 1" signal of FIGS. 11a, 11b. This makes the circuit responsive to both rising and falling edges.

Figure 12A:
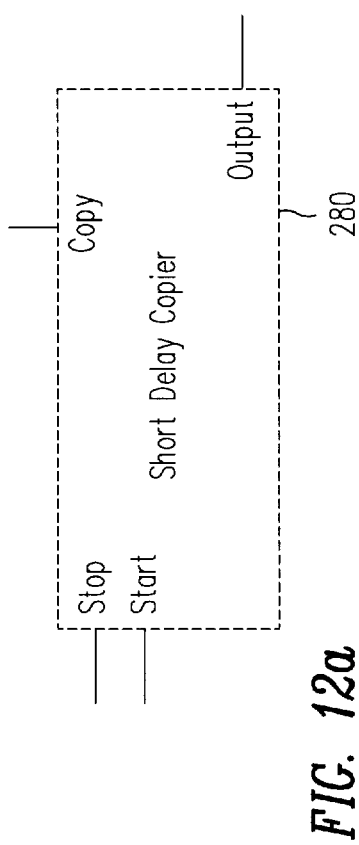
FIGS. 12a and 12b show a delay copier suitable for short delays, having a delay comprising a simple chain of logic gates.
Figure 12C:
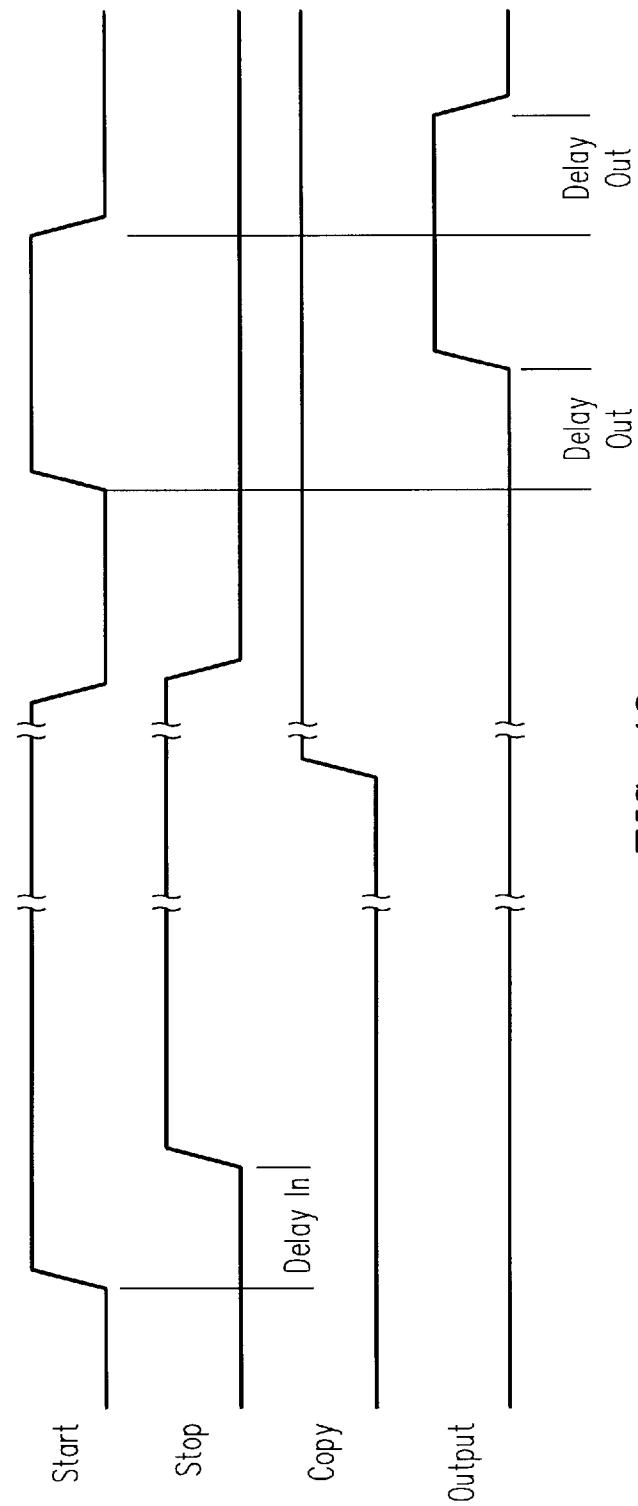
FIG. 12c shows related waveforms.
Figure 12B:
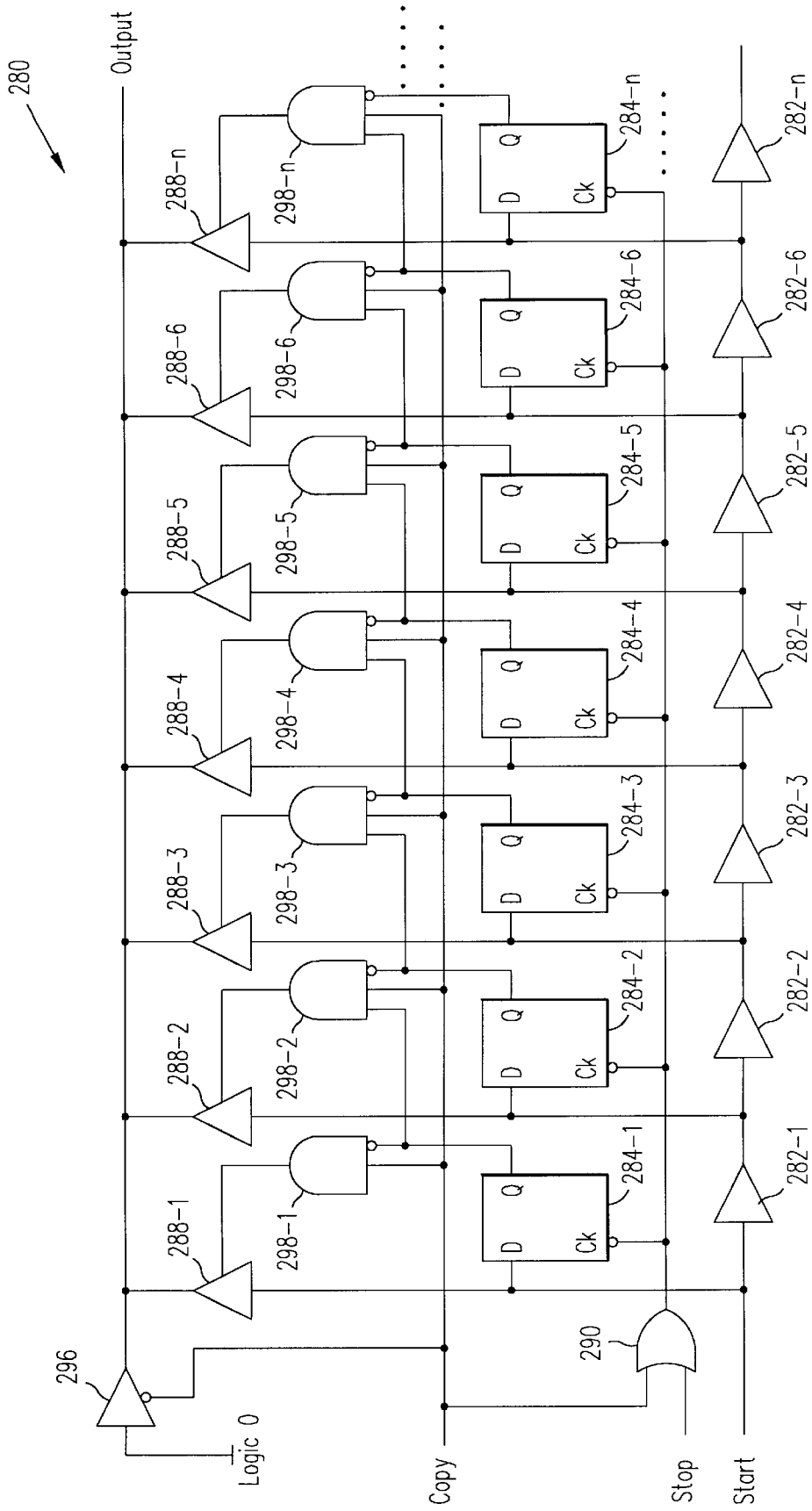

In the delay copier circuit 212, relatively short delays (e.g. 5 to 100 ns) may be copied using the delay copier circuit 280 shown as a single block in FIG. 12a and in detail in FIG. 12b, including a delay line made of buffers 282-1, . . . , 282-n in series, parallel latches 284-1, . . . , 284-n (level-sensitive or D-type) which capture the state at every buffer in the delay line at the instant that the stop (or copy) input signal goes high, and tri-state buffers 288-1, . . . , 288-n connected to a common output line 290. AND gates 298-1, . . . , 298-n detect which pair of adjacent latches have captured different logic values and thus record how far the signal propagated along the delay line. Only one tri-state buffer is enabled by a latch, i.e. the latch which corresponds to how far the original signal propagated along the delay line. One extra tri-state buffer 296 is provided to drive the output when no other buffers are enabled. A NOR gate 290 ensures that when the delay has been copied and signal COPY is logic high, the latches retain their setting, independent of the state of the STOP input.

The waveforms for this circuit are shown in FIG. 12c. The rising Start edge is provided by one of the edge-type converters shown in FIGS. 11a, 11b, 11c, and the rising Stop edge is also provided by one of the converters in FIGS. 11a, 11b, 11c. After the Stop condition has been detected (or was expected), the Copy signal goes high to lock-out any further changes, and to allow subsequent Input signals from the oscillation delay and control Block 14 to be delayed by a copy of the original delay. The oscillation signals will travel along the delay line and proceed to the Output through the single enabled tri-state buffer.

To calibrate the delay copier, a known reference delay (greater than zero), such as a single clock period, is copied and measured, and the difference, t0, is stored in a register. The known correct value for the reference delay is subtracted from t0, to obtain tE, and stored in a register (or the counter 35 of FIG. 1). Next, the delay of interest is copied and measured, and tE is added to obtain the correct delay value.

Figure 13A:
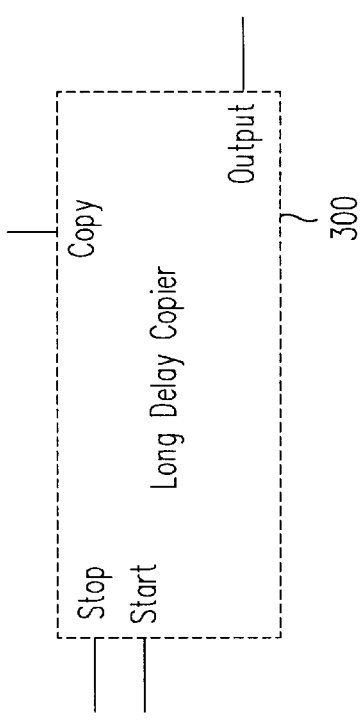
FIGS. 13a and 13b show a delay copier for long delays, having a delay loop and a lap counter of arbitrary size.

For relatively long delays, a copy delay circuit 300 such as that of FIG. 13a (shown in detail in FIG. 13b) is used. Circuit 300 includes a delay line (buffers 302-1, . . . , 302-n) whose output terminal has been connected to its own input terminal to form a ring oscillator (it is possible to use here instead the delay chain in the oscillation delay block 14). As in the delay copy circuit of FIG. 12a, latches or D-type flip-flops 304-1, . . . , 304-n capture the location of the leading edge of the input signal after it enters the delay line; in addition, a "lap" counter including elements 305, 306, 312, 314 counts how many times the signal edge has travelled around the ring oscillator loop. On even laps, the leading signal edge is rising, and on odd laps the leading edge is falling, so both types of edge detectors are used, counter 306 responds to falling edges and counter 312, 314 responds to rising edges. The lap counter is e.g. a binary counter or a linear feedback shift register (LFSR) which is simpler and faster.

A D-type lap count register 310 captures the value of the lap counter when the stop edge is detected. The lap counter 306, 312, 314 is disabled when the stop is detected, to prevent further counting. The copy signal can now go to logic 1, and a subsequent rising input edge will travel around the ring oscillator until the lap counter 306 output is equal to the lap count register. Then the ring oscillator signal is routed to the output terminal through the single enabled tri-state buffer, one of buffers 342, 344, 356, 358, . . . If the number of laps is odd, an inverting tri-state buffer 344, 358, . . . is selected; if the number of laps is even, a non-inverting tri-state inverter 342, 356, . . . is selected.

Figure 13C:
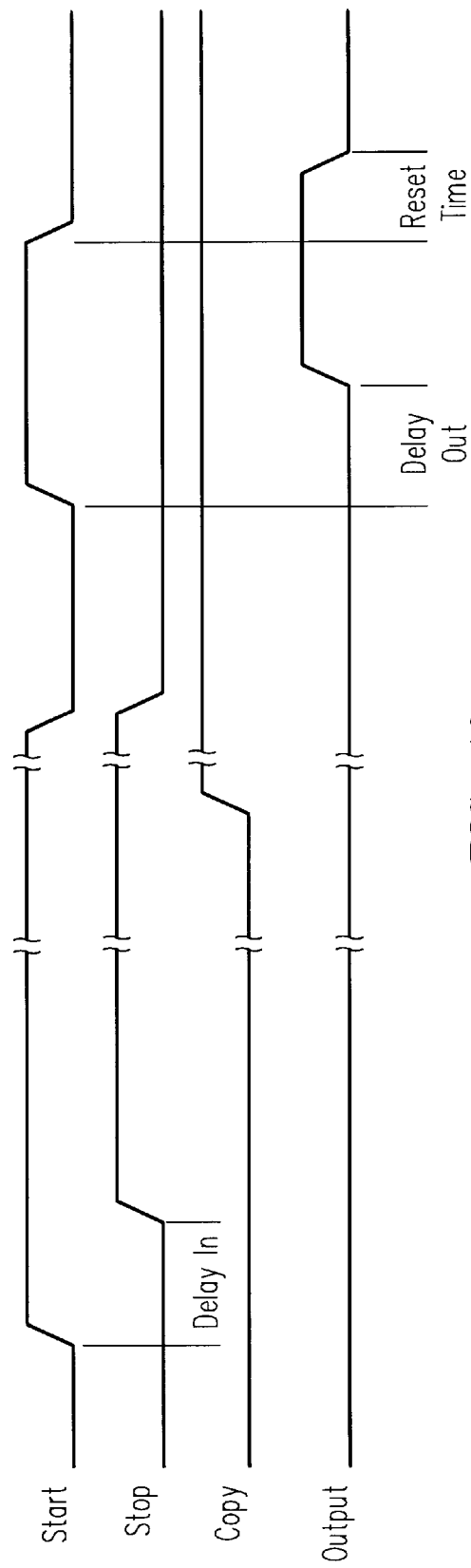
FIG. 13c shows related waveforms.
Figure 13B:
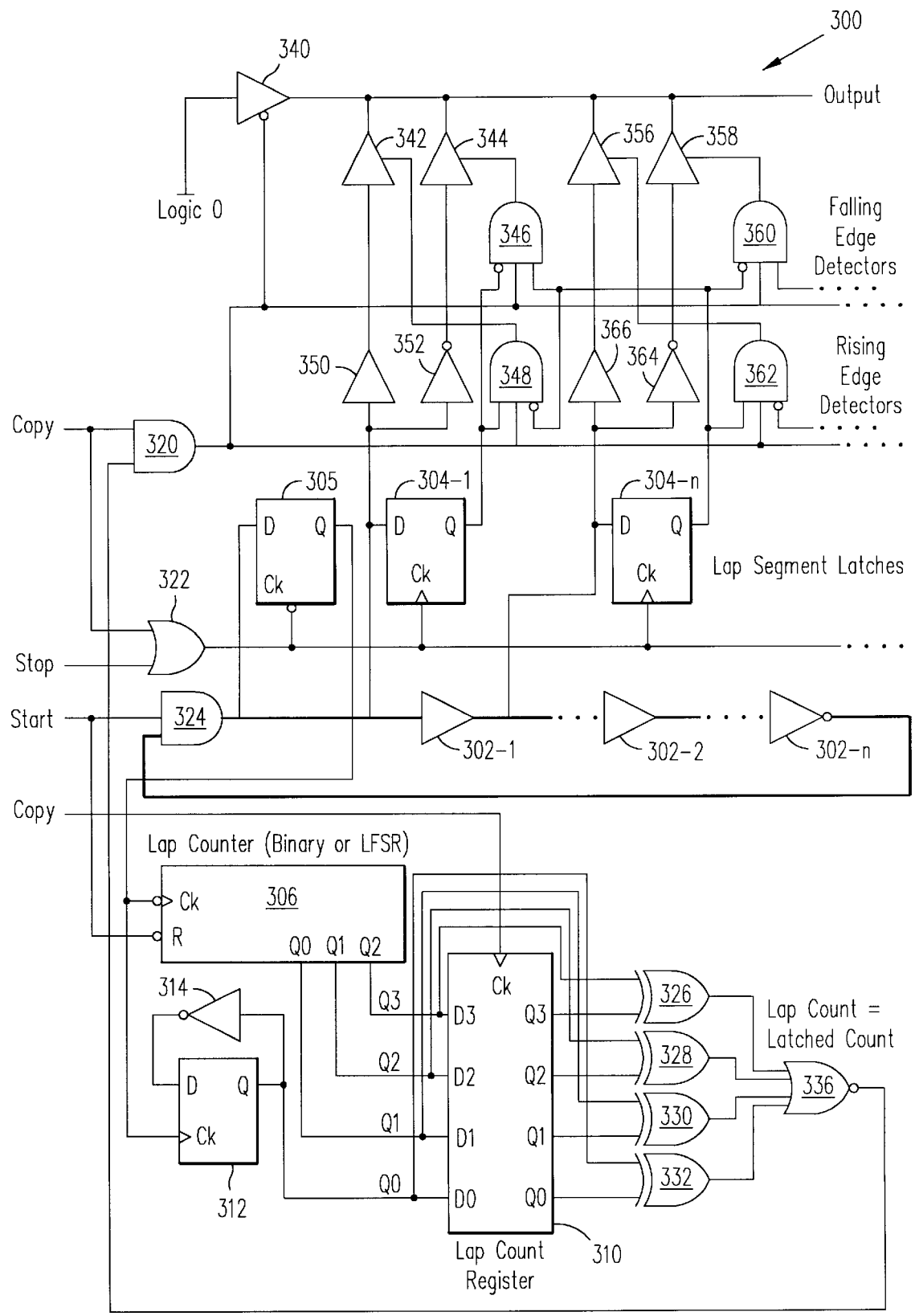

FIG. 13c shows waveforms for the delay copier of FIGS. 13a, 13b.

As one skilled in the art would expect, the accuracy of delay measurements using the exemplary circuits disclosed above can be improved by making more nearly equal the delays of the tri-state buffers that drive each test bus wire, or the two delays of the logic gates which are selectably inverting or non-inverting logic gates, or by reducing the resistance in the test bus wires (less resistance is better).

It is to be appreciated that implementation of the embodiments of present invention includes providing circuitry of the type disclosed above and using this circuitry as described above. In one version the circuitry is provided in the form of a VHDL circuit description for logic synthesis, automatic layout, and IC fabrication, but this is of course not limiting. A particular advantage of this invention, relative to Dalzell, is the tolerance to indeterminate interconnecting wire length and the variance in gate delays caused by this.

The above description relating to clocked (sequential) logic is of a D-type flip-flop (indicated by a triangle at the clock input terminal in all the figures). This disclosure also applies to more complex types of flip-flops and other clocked logical elements, that is to say, the D-type flip-flop is the most primitive of the edge-triggered devices of the sequential logic type which may be tested in accordance with this invention. A latch can be tested as combinational logic delay.

The implementation of the P1149.4 bus is well known and therefore not described in further detail herein. The IEEE P1149.4 standard has been established for testability buses, and describes a protocol and other rules agreed upon at the various levels of test hierarchy. It is to be understood that the present invention, when used for inter-IC or intra-IC delays is not limited to use of the IEEE P1149.4 standard type of test bus but is more generally applicable to an integrated circuit or a system including several integrated circuits, which provides an analog test bus including at least two conductors with the capability to connect selectably to various pins (pads) and/or other points of interest on the integrated circuits. Not every IC pin need be connected to the bus in certain embodiments.

This disclosure is illustrative and not limiting; further modifications will be apparent to one skilled in the art, and are intended to fall within the scope of the appended claims.

We claim:

1. An integrated circuit including:
   a plurality of circuit elements and interconnecting signal-carrying conductors;
   a test bus including two test bus conductors;
   a plurality of switches associated with each signal-carrying conductor, the switches selectably connecting the signal-carrying conductor to either or both of the two test bus conductors;
   wherein at least two of the switches are enabled such that an oscillation circuit is formed including, in series;
   one of the test bus conductors;
   one of the switches;
   one of:
      (a) a selected path of interest through the circuit elements;
      (b) a circuit which has a delay proportional to the delay through the selected path of interest; and
      (c) a reference delay path having a known delay;
   another of the switches;
   another of the test bus conductors; and
   a path with constant delay which is selectably connected between the two test bus conductors.

2. The integrated circuit of claim 1, further comprising means for calculating a difference between a delay of the selected path of interest and a delay of the reference delay path, by subtracting an oscillation period when the oscillation circuit contains the reference delay path from an oscillation period when the oscillation circuit contains one of the selected path of interest and the proportional delay.

3. The integrated circuit of claim 1, further comprising a counter connected to a node in the oscillation circuit.

4. The integrated circuit of claim 1, further comprising means for selecting the constant delay path to be inverting or non-inverting.

5. The integrated circuit of claim 1, wherein the reference delay path includes a tri-state buffer connected directly between the two test bus conductors.

6. The integrated circuit of claim 1, wherein the path of interest includes sequential logic elements and the output signal of the logic elements is responsive to one of a rising or falling input signal.

7. The integrated circuit of claim 1, further comprising means for generating a pulse at an output terminal of the constant delay path in response to a single input signal transition, and wherein a last edge of the pulse has a same constant delay as the edge when only an edge is generated.

8. The integrated circuit of claim 7, wherein at least two pulses are generated by the means for generating, and a last edge of the last pulse has the same constant delay as the last edge as when only a single pulse is generated.

9. The integrated circuit of claim 7, wherein the generated pulse is selectably one of a rising edge followed by a falling edge, and a falling edge followed by a rising edge.

10. The integrated circuit of claim 7, wherein the generated pulse is in response to only one of a rising or falling input signal.

11. The integrated circuit of claim 1, wherein oscillation is initiated in the oscillation circuit by generating a constant logic low or high signal at an output terminal of the constant delay path while the path of interest is enabled, thereby driving all logic gates in the path of interest to a steady-state value, and then generating a signal edge independent of an initial input signal to the constant delay path.

12. The integrated circuit of claim 1, wherein oscillation is initiated in the oscillation circuit by detecting whether the path of interest is inverting or non-inverting, and further comprising means for selecting whether the constant delay path is appropriately non-inverting or inverting respectively.

13. The integrated circuit of claim 1, wherein oscillation is initiated in the oscillation circuit for a path of interest which contains sequential logic, by generating, when the initiation is complete, a pulse having an inactive edge followed by an active edge.

14. The integrated circuit of claim 1, further comprising means for setting the proportional delay by copying a delay through the delay path of interest after detecting a single start and subsequent stop condition, or after detecting multiple start and subsequent stop conditions.

15. The integrated circuit of claim 14, wherein the start and stop conditions are rising or falling signal transitions, whereby the delay to be copied is started or stopped as selected.

16. The integrated circuit of claim 14, wherein no enabled signal path exists between signal wires at which start and stop conditions are detected.

17. The integrated circuit of claim 14, further comprising:
   a delay chain of logic gates tapped at intervals by latching elements which latch their input values when the stop condition is detected, and an input signal to the delay chain is selectably the start signal or said oscillation loop signal;
   logic connected to the latching elements for detecting which latch element corresponds to a distance along the delay chain that the start signal progressed; and
   a common output line driven by tri-state buffers whose input terminals are taps of the delay chain and which are enabled by the logic connected to the latch elements, and by a mode signal.

18. The integrated circuit of claim 14, further comprising:
   a delay chain of logic gates tapped at intervals by latching elements which latch their input values when the stop condition is detected, and the input to the delay chain is selectably the start signal or said oscillation loop signal or the other end of the delay chain;
   logic connected to the latching elements for detecting which latch element corresponds to a distance along the delay chain that the start signal progressed; and
   logic connected to the latching elements for detecting how many times an original input signal transition has progressed around the delay chain loop; and
   a common output line driven by tri-state buffers whose input terminals are taps of the delay chain and which are enabled by the logic connected to the latch elements, and by a mode signal and by logic which detects when a number of laps traveled by a signal to be delayed is equal to a number of laps traveled by the signal that was copied.

19. The integrated circuit of claim 1, wherein a setup and hold time of the selected path of interest which includes a sequential logic circuit is estimated by finding a minimum delay through a selectably tapped delay chain of logic gates, which when added to a data signal supplied to the sequential logic circuit relative to a clock signal supplied to the sequential logic circuit, causes the sequential logic to change state, and this delay through the tapped delay line is measured by selectably including it in the oscillation circuit.

20. The integrated circuit of claim 1, wherein a setup and hold time of the selected path of interest which includes a sequential logic circuit is measured by adjusting a delay through a selectably tapped delay chain of logic gates, which is added to a data signal supplied to the sequential logic circuit relative to a clock signal of the sequential logic circuit, until the sequential logic circuit changes state.

21. The integrated circuit of claim 1, further including other circuits, not on the integrated circuit, wherein the delay path of interest includes elements in the other circuits.

22. The integrated circuit of claim 1, further including at least one other integrated circuit (IC) including two test bus conductors, connected to a common pair of off-chip test bus conductors; wherein a delay t between pins of the integrated circuits is determined by measuring:

a delay t1 from a first test bus conductor pin on a first IC, to a selected signal input on the first IC, to a first pin of the first IC, to the second test bus conductor;

a delay t2 from the first test bus conductor pin on the first IC, into the second IC, through a buffer to the second test bus conductor on the second IC, and into the first IC on said second test bus conductor;

a delay t3 from the first test bus conductor pin on the first IC, to the selected signal input on the first IC, to the first pin of the first IC, to the receiving pin on the second IC2, through a buffer to the second test bus conductor on the second IC, and into the first IC on the second test bus conductor; and a delay from the first pin of the first IC to the receiving pin of the second IC is calculated as t=t3−t2−t.

23. The integrated circuit of claim 1, wherein the path of interest includes an analog circuit, and the path with constant delay has a delay long enough to ensure that an output signal of the analog circuit substantially settles to its steady-state value after receiving a rising or falling signal edge at its input terminal.

24. The integrated circuit of claim 23, wherein the output signal of the analog circuit is converted to a logic 0 or 1 by comparing the output signal of the analog circuit to a constant reference voltage.

25. A method of measuring a signal delay between any two of a plurality of terminals of an integrated circuit, the integrated circuit including two conductors selectably connected to each of the plurality of terminals, comprising the steps of:

connecting each of two terminals of the integrated circuit to one of the two conductors;

measuring a frequency of oscillation of a circuit path of interest including the two terminals and the two conductors; and comparing the measured frequency of oscillation to a measured frequency of oscillation of a reference circuit with a known delay including the two conductors and not including one of the terminals.

26. The method of claim 25, wherein the step of measuring includes providing a predetermined delay to limit the frequency of oscillation.

27. The method of claim 25, wherein the step of measuring further comprises separately measuring a delay of a falling or a rising signal at an output terminal of the circuit of interest, relative to the initiating input signal edge.

28. The method of claim 25, wherein the step of measuring includes selecting a sequential logic delay path of interest which comprises clocked logic elements and combinational logic elements connected between the two terminals.

29. The method of claim 25, wherein the step of measuring includes counting a number of pulses of the oscillation occurring in a period of time proportional to a period of a reference signal of known frequency.

30. The method of claim 25, wherein a minimum pulse width is limited by using N delay elements for the constant delay, and using an output signal from the nth delay element, where 0<n<N, to generate the signal transition or transitions prior to a last signal transition going to the delay path of interest.

31. The method of claim 25, wherein a circuit between the two terminals includes at least one analog circuit element.

\* \* \* \* \*